(12) United States Patent
Day

(10) Patent No.: US 8,157,626 B2
(45) Date of Patent: Apr. 17, 2012

(54) DATA CENTER COOLING

(75) Inventor: Tony Day, Enfield (GB)

(73) Assignee: American Power Conversion Corporation, West Kingston, RI (US)

( * ) Notice: Subject to any disclaimer, the term of this patent is extended or adjusted under 35 U.S.C. 154(b) by 0 days.

(21) Appl. No.: 12/986,115

(22) Filed: Jan. 6, 2011

(65) Prior Publication Data

US 2011/0094714 A1 Apr. 28, 2011

Related U.S. Application Data

(63) Continuation of application No. 12/406,015, filed on Mar. 17, 2009, now Pat. No. 7,878,889, and a continuation of application No. 10/509,434, filed as application No. PCT/GB03/01367 on Mar. 28, 2003, now Pat. No. 7,534,167.

(30) Foreign Application Priority Data

Mar. 28, 2002 (GB) .................................. 02073823

(51) Int. Cl.
*F23L 17/02* (2006.01)
*B60H 1/24* (2006.01)
(52) U.S. Cl. ............. 454/39; 454/116; 454/163; 454/40
(58) Field of Classification Search .................. 454/187; 62/252.9
See application file for complete search history.

(56) References Cited

U.S. PATENT DOCUMENTS

| | | |
|---|---|---|
| 3,120,166 A | 2/1964 | Lyman |
| 3,387,648 A * | 6/1968 | Ward, Jr. et al. ................ 165/47 |
| 3,749,981 A | 7/1973 | Koltuniak et al. |
| 4,016,357 A | 4/1977 | Abrahamsen |
| 4,089,040 A | 5/1978 | Paulsen |
| 4,196,526 A | 4/1980 | Berti |
| 4,315,300 A | 2/1982 | Parmerlee et al. |
| 4,352,274 A | 10/1982 | Anderson et al. |
| 4,672,509 A | 6/1987 | Speraw |
| 4,682,268 A | 7/1987 | Okano et al. |
| 4,710,096 A | 12/1987 | Erlam |
| 4,851,965 A | 7/1989 | Gabuzda et al. |
| 4,860,163 A | 8/1989 | Sarath |

(Continued)

FOREIGN PATENT DOCUMENTS

DE 2537295 A1 4/1976

(Continued)

*Primary Examiner* — Steven B McAllister
*Assistant Examiner* — Helena Kosanovic
(74) *Attorney, Agent, or Firm* — Gilman Clark & Hunter LLC

(57) ABSTRACT

A system includes a substantially sealed, substantially airtight cabinet sized for housing a vertical array of heat-producing units, the cabinet having an exterior shell and the system including an interior divider wall disposed inside the cabinet, the shell and divider wall providing an equipment chamber adapted to support the array such that the array cooperates with the shell and divider wall in use to define a first plenum, the first plenum having a first inlet defined by the divider wall for receiving a flow of cooling gas and having a first outlet defined by a plurality of openings through the array whereby the first plenum communicates with the openings in use to exhaust substantially all of the flow of cooling fluid through the openings and hence through the array, wherein the divider wall is configured to allow the first inlet to admit the gas to the first plenum in a substantially horizontal direction.

28 Claims, 10 Drawing Sheets

U.S. PATENT DOCUMENTS

| | | | |
|---|---|---|---|
| 4,901,138 A | 2/1990 | Kushibiki et al. | |
| 5,150,277 A | 9/1992 | Bainbridge et al. | |
| 5,184,879 A | 2/1993 | Brossardt et al. | |
| 5,285,347 A | 2/1994 | Fox et al. | |
| 5,329,425 A | 7/1994 | Leyssens et al. | |
| 5,414,591 A | 5/1995 | Kimuara et al. | |
| 5,460,441 A | 10/1995 | Hastings et al. | |
| 5,467,607 A | 11/1995 | Harvey | |
| 5,509,468 A | 4/1996 | Lopez | |
| 5,544,012 A | 8/1996 | Koike | |
| 5,657,641 A | 8/1997 | Cunningham et al. | |
| 5,671,805 A | 9/1997 | Stahl et al. | |
| 5,709,100 A | 1/1998 | Baer et al. | |
| 5,765,743 A | 6/1998 | Sakiura et al. | |
| 5,823,005 A | 10/1998 | Alexander et al. | |
| 5,826,432 A * | 10/1998 | Ledbetter | 62/196.4 |
| 5,851,143 A | 12/1998 | Hamid | |
| 5,949,646 A * | 9/1999 | Lee et al. | 361/695 |
| 5,952,842 A * | 9/1999 | Fujimoto | 324/750.08 |
| 5,953,930 A | 9/1999 | Chu et al. | |
| 5,982,616 A | 11/1999 | Moore | |
| 6,041,851 A | 3/2000 | Diebel et al. | |
| 6,065,531 A | 5/2000 | Schneider et al. | |
| 6,088,225 A | 7/2000 | Parry et al. | |
| 6,104,003 A * | 8/2000 | Jones | 219/400 |
| 6,127,663 A | 10/2000 | Jones | |
| 6,164,369 A | 12/2000 | Stoller | |
| 6,185,098 B1 | 2/2001 | Benavides | |
| 6,186,890 B1 | 2/2001 | French et al. | |
| 6,198,628 B1 | 3/2001 | Smith | |
| 6,208,510 B1 | 3/2001 | Trudeau et al. | |
| 6,222,730 B1 | 4/2001 | Korvenheimo et al. | |
| 6,285,157 B1 | 9/2001 | Hain et al. | |
| 6,302,147 B1 * | 10/2001 | Rose et al. | 137/614.03 |
| 6,351,381 B1 | 2/2002 | Bilski et al. | |
| 6,374,627 B1 | 4/2002 | Schumacher et al. | |
| 6,375,561 B1 | 4/2002 | Nicolai et al. | |
| 6,463,997 B1 | 10/2002 | Nicolai et al. | |
| 6,506,111 B2 | 1/2003 | Sharp et al. | |
| 6,515,225 B1 | 2/2003 | Wright | |
| 6,516,954 B2 | 2/2003 | Broome | |
| 2001/0029163 A1 | 10/2001 | Spinazzola et al. | |
| 2001/0042616 A1 | 11/2001 | Baer | |
| 2002/0185262 A1 | 12/2002 | Baer | |

FOREIGN PATENT DOCUMENTS

| | | |
|---|---|---|
| DE | 3316978 A1 | 11/1984 |
| DE | 19728306 C2 | 1/1999 |
| EP | 230083 B1 | 7/1987 |
| EP | 621451 A2 | 10/1994 |
| EP | 468597 B1 | 6/1998 |
| EP | 1017263 A2 | 7/2000 |
| EP | 1120610 A2 | 8/2001 |
| GB | 2202681 | 9/1988 |
| GB | 2359933 A | 9/2001 |
| WO | 9913273 | 3/1999 |
| WO | 0162060 A1 | 9/2001 |
| WO | 0172099 A2 | 9/2001 |
| WO | 0212797 A2 | 2/2002 |
| WO | 02102124 A2 | 12/2002 |

* cited by examiner

DATA CENTER COOLING

CROSS-REFERENCES TO RELATED APPLICATIONS

This application is a continuation application of U.S. patent application Ser. No. 12/406,015 filed Mar. 17, 2009, which is a continuation application of U.S. patent application Ser. No. 10/509,434 filed Jun. 6, 2005, which claims priority under 35 USC §371 to Application No. PCT/GB03/01367, filed Mar. 28, 2003, and to United Kingdom Application No. 02073823, filed Mar. 28, 2002, all of which are incorporated by reference in their entireties for all purposes.

FIELD OF THE INVENTION

The invention relates to cooling techniques and in particular to cooling data centers.

BACKGROUND

This disclosure relates to the art of data centers, and in particular to data processing centers in which banks of servers or other equipment are housed in a protected environment. Specific aspects of the disclosure relate to housings or cabinets for electronic equipment for use in both controlled environments (e.g. computer/data rooms) and non-controlled environments (e.g. ordinary offices, factories, external sites etc.). Although currently intended for housing electronic equipment, the disclosure is not limited to this use and instead can be utilized with respect to any equipment for which forced air cooling is useful.

Data centers are important business facilities which aim to provide protected environments for housing electronic equipment, such as computer and telecommunications systems, for a wide range of applications. With ever-increasing numbers of individuals and businesses relying on the internet, hence giving rise to e-facilities such as application service providers, internet service providers, network operation centers, and co-location and web-hosting sites, data centers are becoming busier and more common. In particular, the growth of the internet has resulted in unprecedented levels of server-based computing. Providers have found that many of their network infrastructure and web applications work best on dedicated servers.

While embodiments of the disclosure will be described in the context of internet-related equipment, broader applicability is within the scope of the disclosure. References to data centers in this specification are therefore to be construed broadly to encompass installations that do not necessarily relate to the internet, such as those involving telecommunications, or any other equipment assembly using forced air cooling.

Computer and telecommunications systems are commonly gathered into data centers because their sensitive electronics require protection from hazards in the surrounding environment such as air-borne dust, spillages and fluctuations in temperature and humidity, as well as from the ever-present danger of power disturbances such as outages, surges and spikes. Flooding and fire monitoring/suppression systems are also required. It makes commercial sense that these protective facilities are shared between users or tenants of data centers, although some data centers are devoted to a single corporate user.

The equipment housed within data centers can be very valuable, but the data stored by that equipment is potentially of much greater value, as is the cost of downtime should the equipment fail. Consequently, the operators of data centers assume a great responsibility for ensuring the protection and continuous fault-free running of the equipment that they house. Tenants can be expected to claim substantial damages if those objectives are not met.

In recent years, items of electronic equipment such as servers have shrunk in size to the extent of being suitable for rack mounting. Now, therefore, servers in a data center are usually housed in equipment racks or cabinets of a generally standard size and shape enabling servers and their supporting equipment to be housed in a modular, interchangeable fashion. Racks or cabinets are typically supported on raised floors beneath which complex cable networks for electrical interconnection for both power supply and system communication can be laid while allowing access for maintenance and re-routing.

An equipment rack is an open frame with a system of uprights having holes spaced at set modular centers, which are referred to as unit spacings or, for short, U's, 1U represents a vertical spacing of 1.75 inches (44.45 mm). The width between the uprights (a unit spacing width) usually conforms to a standard of either 19 inches (483 mm) or 27 inches (675 mm). Electronic equipment is typically manufactured in a chassis form for rack mounting in accordance with these standard modules, although non-standard sizes are of course possible for specific applications.

An equipment cabinet is essentially a rack as described above but mounted inside an enclosure. The cabinet has access doors at front and rear to allow maintenance access to the equipment within and provides a degree of physical security to the equipment. A typical so-called 'standard cabinet' would have an external width of either 600 mm or 800 mm, an external depth of either 800 mm or 900 mm, and an external height of at least 2100 mm. Such a cabinet would be capable of accommodating a stack of 42 to 45 1U units and so would be termed a 42U or 45U cabinet as appropriate.

Units mounted within a rack or cabinet need not necessarily be server units: for example, uninterruptible power supply (UPS) units are often installed to maintain and smooth power supply to other units.

The access doors of a cabinet may be solid, glazed, perforated or a combination of these, and will usually be lockable by means of keys or digital keypads. More sophisticated locks relying upon scanners such as thumbprint or palm readers are also possible.

Equipment racks or cabinets are typically arranged in rows within a so-called technical space in a data center with an aisle space between them of approximately 1200 mm and sometimes as small as 900 mm. This aisle space, also known in the art as 'white space', affords access to technical personnel for the purposes of maintenance, monitoring, installation and so on.

As mentioned above, some data centers may be shared by several tenants who house equipment there and so require access to the center. While this raises security concerns, these concerns may be partially overcome by restricted personnel access to the technical space. However, the more access takes place, the more difficult it becomes to maintain a closed environment in which temperature, humidity and ingress of dust or other contaminants can be controlled. For example, to achieve a clean environment IP (ingress protection) rating under British and European standards, a sealed filtered system is required which is difficult when the sealed system is an entire room. Also, a multi-tenant facility also increases the chances of accidental damage to equipment, such as impact damage or spillage of liquids.

Smoke and fire detectors and fire fighting capabilities are important features of data centers. Early fire detection and efficient fire suppressant systems are vital for minimizing equipment damage, data loss, system downtime and service interruption in the event of an actual or impending fire.

To minimize equipment damage, many users and operators prefer inert gases to water sprinkler systems for dousing fires. However, in recent years, some operators have omitted gas protection due to the high capital cost of the system and the high cost of recharging the system once discharged. Many gases are also environmentally unsound. In known environmentally conditioned data center systems, the gas or water system normally discharges into the technical space as a whole and the entire room is closed off, and the equipment within shut down, while the particular server or other equipment unit at fault is detected and removed.

Equipment manufacturers and industry standards specify tight tolerances for environmental conditions to ensure optimal performance of the equipment. For example, relatively small but sudden fluctuations from the recommended operating temperature (e.g. at a rate of temperature change of as little as 10° C. per hour) can cause thermal shock and damage delicate circuits. High humidity can corrode switching circuitry causing malfunctions and equipment failures, whereas low humidity can promote static electricity that interferes with proper equipment operation.

The environmental conditions of a data center are largely determined by a combination of the equipment heat load in the room and the temperature and humidity loads resulting from infiltration of outside air. Other load factors include people working within the technical space, who introduce heat and humidity, and lighting of the technical space, which introduces radiant and convective heat. However, the dominant challenge in environmental control of the technical space is the generation of heat by the electronic equipment housed within.

The heat generated by electronic equipment is related to the power consumed by that equipment. New designs of electronic equipment which are more compact than previous models tend to have higher power consumption and therefore a greater heat output. In particular, the desire for compactness has been driven by the commercial need to fit as many servers as possible into existing data centers. Smaller servers and a denser population of servers are required to return as much revenue as possible per square meter of rackable area within the data center.

To this end, servers have been designed that fit into 1U of space; these '1U servers' are also referred to as 'high density' servers. Such servers are relatively heavy and have a high heat output of up to 1000 BTU's per hour (293 W) per server, the level of which depends on the server configuration in terms of number of processors, hard drives etc., and the software type and data being processed. So, while racks or cabinets can in theory be filled with such high density equipment, in reality, overheating may occur in that event. Servers present a considerably greater challenge in this respect than other equipment apt to be rack-mounted, such as UPS units.

Overheating has become a major issue since high density server deployment began. As recently as three years ago, typical electrical loads were between 300-400 W/m2 of rackable space within the technical area but today 1200 W/m2 is the average with some installations being as high as 2000 W/m2. This increase in power consumption is reflected in heat output within the technical space, which in turn adds to the cooling load and hence to the overall power requirement of the data center. Indeed, the overall power requirement has almost doubled over the three-year period. This presents another challenge in terms of inadequate power supply.

Those designing cooling systems for data environments are faced with not just the problem of ever greater cooling load requirements, but with predicting the size of the load to be allowed for at any given point of time. Moore's Law predicts the doubling of semiconductor performance every eighteen months. If Moore's Law continues to hold (and it is anticipated that it will, at least through 2005), there will continue to be a dramatic and continuing increase in product power densities, coupled with the design of smaller devices which is now being referred to as the problem of 'compaction'.

With compaction comes an increasing amount of cabling to make the connections to the greater number of smaller devices housed in a rack. New category cables such as 'Cat 6' are larger in diameter than those of earlier generations, which both restricts airflow within the rack and adds to the total rack weight. The electronic equipment itself now tends to be provided with dual-corded power supplies, or triple-corded in some cases. The power supplies, often 'hot pluggable', add to the device weight and therefore to the overall rack weight. In fact, some racks have to be braced as they near their maximum slenderness ratio.

The risk of overheating means that cabinets are very often left unfilled: they are not fully populated with servers or other equipment, meaning that some available levels remain unused. This is to the detriment of efficient space utilization within the data center and, ultimately, increases the cost of housing each server because fewer servers or fewer tenants share the infrastructure costs of the data center.

In existing data centers, temperature regulation is commonly achieved by close control room air conditioning units (also known as computer room air conditioning or CRAC units) within the technical space. An example of such a conventionally cooled data center is shown in FIG. 1.

The conventional computer/data room cooling technique illustrated in FIG. 1 is the typical approach to cooling electronic equipment currently employed. Within an enclosed room 1 defined by a room floor 5, side walls 3 and a ceiling 4, a suspended raised floor 2 is installed at a pre-determined height above the base floor 5. The suspended floor 2 and the base floor 5 together constitute a double floor structure defining a free space or floor void 6 which is used as an air passageway and often as a technical service zone for power and data cables. The raised floor structure 2 comprises a plurality of panels which permit access to the floor void 6 from above.

Sometimes a suspended ceiling 7 having a plurality of ceiling panels is provided below the base ceiling 4. The suspended ceiling 7 and the base ceiling 4 combine to form a double ceiling structure defining a free space or ceiling void 8 which is used as a technical service zone for cables, light fittings etc.

Open racks 9 or rack cabinets, into which electronic devices may be fitted, are disposed on the raised floor 2 within the 'technical space' defined by the room 1. Power and data cables for the racks 9 may run through the floor void 6 of the raised floor, the ceiling void 8 of the ceiling structure, the room space 1 over the floor or beneath the ceiling, or any combination of these. When cables are run at a high level in the room space 1, the suspended ceiling 7 is often omitted. Often, so-called static cables should be located in the floor void, these cables being mainly heavy copper cable such as for power supplies, and control data cables, all of which may be expected to remain in situ for extended periods. Conversely, more fragile or frequently-moved cables should be located at a high level within the technical space or in the ceiling void 8 where they can be concealed by removable panels and/or supported by suitable supports (not shown). These cables may include data cables such as fiber, twisted-pair and coaxial cables. Such cables are relatively vulnerable to damage, as may for example be caused by maintenance engineers walking on exposed cables when the floor panels are lifted.

Positioning such cables at a high level reduces the risk of damage and eases access to them for installation, maintenance and re-routing.

A rack 9 comprises a vertical framework of rails provided with suitable mounting holes to appropriate industry standards (e.g. EIA-310-D), to accept electronic equipment. The rack 9 is either open to the room space 1 or is mounted inside an enclosure to form a rack cabinet 11 which has various air inlets and air outlets allowing cooling airflow to reach the electronic equipment 12 and to carry heat away.

Electronic equipment most commonly ventilates front to back, that is, air flows through ventilation holes in the front of the equipment casing and exhausts through holes in the rear of the casing. Small fans, usually in the rear of the casing but in some cases in the front, assist this through airflow. The heat from the electronic components within the casing is dissipated by convection or individual fan assistance into this through airflow, thus effecting cooling of the equipment. There are some items of equipment that ventilate bottom to top, or side to side, but the principle remains the same.

The rack cabinet 11 will most often be provided with ventilation slots or perforations in the front and rear doors to provide for through airflow. Many rack cabinets will also have a ventilation inlet within a cabinet bottom plate 13 and another in a cabinet top plate 14 to avoid a concentrated heat build-up in the top of the cabinet due to the so-called 'stack effect'. Either of these two openings or in some cases both may be augmented by fans 15, preferably in multiple arrays to provide for redundancy.

The raised floor system 2 comprises a plurality of floor panels, some of which are solid and some of which are perforated or of a grille-type construction 2b permitting airflow through them from the floor void 6 to the room space 1. The suspended floor panels are supported on pedestals 2a which are fixed to the base floor 5 by screws and adhesive on a regular modular grid. The airflow from the perforated panels or grilles 2b flows out into the room space 1 and is drawn through the fronts of the equipment cabinets 11 into, through and between the units of electronic equipment within.

Sometimes dampers will be fitted to the floor grilles 2b to allow adjustment to the airflow and manual balancing of the room loads.

At the perimeter of the room 1, a plurality of close control computer room air conditioning units 16 (CRAC units) receive air flowing perpendicularly to the rows of rack cabinets 11. In large rooms, some of these CRAC units 16 may also be provided within the room space away from its periphery to overcome distance limitations upon the effectiveness of the units 16. Also, CRAC units 16 may sometimes be positioned outside a room and connected to it through appropriate openings in the perimeter wall of the room 1.

Each CRAC unit 16 comprises a heat exchanger or coil 17 and a fan 18. Exhaust air from the rack cabinets 11, mixed with room air, is drawn into an inlet 20 of the CRAC unit 16, across the cooling coil 17 and through the fan 18 and out an outlet 19 into the floor void 6. There are various types of CRAC units each of which rejects the room heat absorbed in different ways, namely chilled water units, direct expansion water-cooled units, direct expansion air-cooled units, direct expansion glycol-cooled units and others. However they typically share the same principle, which is that the absorbed heat is conveyed to a suitable point outside the room 1 where it is dissipated to atmosphere using conventional air conditioning technology. Thus, the unit is connected to a central plant via a cooling circuit which may consist of distilled water or other refrigerant. The cooling circuit dissipates heat to the atmosphere outside the technical space via heat exchangers such as cooling towers or external radiators (dry coolers).

The CRAC units 16 described and illustrated are referred to as 'downflow' units reflecting the generally downward airflow within them in use, but 'upflow' units are also available. Upflow CRAC units are used, for example, where there is insufficient room height for a suspended raised floor or where the equipment servicing philosophy is such that services are run overhead, thus obviating a raised floor. Either way, the principle is similar except that in the case of an upflow CRAC unit, the air inlet is at the front bottom of the unit and room air passes up through the unit before being expelled at the top where it moves out and down in front of the rack cabinets 11 before being drawn through the electronic equipment as in the previous scenario.

Ambient room air is typically at a temperature of 22° C.±2° C. with relative humidity of 50%±5%. The CRAC units 16 supply chilled air to the floor void 6 at approximately 13° C. which is drawn into the rack cabinets 11 by either convection from the airflow from the perforated panels/grilles 2b or by the effect of the cabinet fans. As the chilled air passes through and around the electronic equipment units and is heated, it exhausts out into the room space 1 at approximately 35° C. The heated air then mixes with the conditioned ambient air of the room which is at a temperature of approximately 22° C., and the mixed air then returns to the CRAC units 16 at a temperature of approximately 24° C.

Other perforated tiles 2b are positioned throughout the room 1 to provide air supply to other heat-generating equipment and to maintain an appropriate ambient environment in the room 1. Some rooms are laid out on the principle of 'hot and cold aisles', in which rows of cabinets 11 are arranged so that their fronts face each other across a 'cold' aisle, from which cold air is drawn into the opposed cabinet fronts, and their backs face each other across a 'hot' aisle, into which warm air is exhausted from the opposed cabinet backs. Perforated panels or grilles 2b are only placed in the cold aisles (other than those serving other pieces of equipment elsewhere in the room), thus seeking to ensure the maximum cooling effect by not mixing cold and hot airflows in the same aisles.

The large floor-mounted CRAC units distributed around the perimeter and sometimes in the center of the technical space take up floor space and room volume that could otherwise be devoted to racks or cabinets. This ultimately costs money by loss of potential revenue generation. However, the alternative of air conditioning vents positioned in the ceiling or in walls close to the ceiling, as commonly found in offices, is not suitable for a data center. This is because as heated air rises from the server racks or cabinets, it mixes with the cooler air blowing down from the air conditioning vents leading to condensation and formation of water droplets which can damage computer equipment. Hence, it is preferred that air conditioning vents are located below the server racks so that the natural airflow is not disrupted.

As can be seen in FIG. 1, the cold air cooled by the condenser is forced out 5 underneath the CRAC unit 16 below a raised floor 2 on which the CRAC unit 16 is mounted. The raised floor 2 acts as a plenum under positive pressure. Some of the cold air is forced up through cable/ventilation holes in the base of the equipment cabinets 11 mounted on the floor, while some rises through floor ventilation grilles 2b around the cabinets fitted with control dampers. Thus, the total volume of the air in the technical space is conditioned.

As already mentioned, some of the conditioned air in the technical space is drawn through the equipment cabinet 11, for example via perforated doors, by small fans within the servers themselves. This air flows through and around the heat-generating electronic components within the servers and exhausts as hot air at the rear of the server into the cabinet 11. In some cases, however, solid doors are used at the rear of the cabinet 11 and hot air is expelled at the top of the cabinet 11 through an opening, sometimes assisted by additional fans 15 to avoid a concentrated heat build-up in the top of the cabinet 11 due to the 'stack effect'. The hot air then returns to the room 1 where it mixes with the room air and is eventually recirculated through the CRAC unit 16 from which its heat is ultimately rejected to the atmosphere via suitable heat transfer means as aforesaid.

With a general environmental controlling device as described above, all the air within the technical space is being continuously treated. Unsurprisingly, the energy demands associated with such an approach represent a significant cost factor. Also, the cooling of individual servers relies heavily upon their internal fans and there may be no attempt to ensure that each server receives its necessary share of conditioned air. Instead, conditioned air may be introduced into the cabinets 11 by various imprecise means that can give rise to conflicting airflows.

Once in a cabinet, conditioned air is left to flow within the cabinet in a way that depends upon the disposition of equipment within the cabinet. So, for example, a server might receive inadequate cooling because adjacent servers nearer the air intake take a disproportionate amount of conditioned air. Similarly, conditioned air might bypass a server by following a path of less resistance, for example through an adjacent empty equipment bay within the cabinet 11. Also, if a server fan should fail, that server will almost inevitably overheat.

The floor void 6, when used for delivery of the cooling supply air, is often assumed to consist of an even mass of pressurized air delivered from a number of CRAC units 16, arranged around the perimeter and possibly the interior of the technical space. The reality is that the floor void 6 contains a plurality of independent airflow plumes emanating from each CRAC unit 16, segregated by boundary layers. Each of these airflow plumes varies in size due to other factors which affects the amount of cooling which can be provided to the technical space.

A factor in airflow plume development is the static pressure within the floor void 6. Assuming initial design is correct, a lack of static pressure may arise from poorly-managed floor openings and/or from close-coupled rack cabinets with additional fans. Specifically, cut-outs for cable entry below cabinets and elsewhere within the room, together with excessive perforated floor panels or grilles, causes overcooling, loss of static pressure and wasted capacity. High-pressure areas of the floor are overcooled while low-pressure areas overheat because a loss of static pressure reduces the size of a plume and hence the volume of room space that that plume is able to cool.

To mitigate this effect, hole cut-outs should be sealed around cables and the floor grilles 2b should be adjusted to deliver an accurate amount of airflow to each cabinet 11. However, in practice, poorly-fitting floor panels or, more usually, floor panels that have been lifted and replaced badly can result in substantial leakage of cooled airflow from the floor void. If the floor void is used for containing cabling then engineers installing cables typically remove a complete row of floor panels and/or stringers rather than leave occasional panels (typically every fifth panel) in place to keep the floor 'locked-in', with the result that the panels shift across the whole floor in a process called 'fish-tailing', causing gaps to open up.

By way of illustration, site investigations have verified cases where only 31% of the total cooling airflow was being distributed through 'engineered' openings, with the remaining 69% circulating out of cable cuts, gaps around equipment and openings from rack cabinets. The cold air escaping in this way returns to the CRAC units 16 without effectively transferring heat from the equipment. This cold 'return' or 'bypass' air disrupts the heat transfer that could have been available to overloaded air conditioners, in such cases reducing the effectiveness of the CRAC units 16 to just 52% of their capacity.

The act of installing cabling within the floor void 6 further restricts airflow through the floor void 6. This is a degenerative effect, as the rack cabinets 11 are populated over time and a potentially greater heat load created, the additional associated cabling further restricts the airway supplying the cooling airflow through the floor void. The combination of new cabling technology, in which cables tend to be of larger diameter, together with electronic equipment 'compaction' results in more densely occupied equipment spaces, connected by increasing amounts of cable.

While it is correct in principle to attempt to reduce the inlet air temperature entering the rack cabinets 11 by increasing the airflow rate through the perforated floor panels, this is an oversimplification. If the velocity is too high, then the airflow can overshoot a rack cabinet 11, tumbling into the hot aisle at the rear of the rack cabinet 11. This wastes supplied chilled air and, by mixing with the exhausted heated air from the rack cabinet 11, lowers the temperature of the exhausted air and therefore reduces the capacity of the installed air conditioners.

Moreover, unless carefully engineered, increased air velocity can create a 'wind tunnel' under a raised floor. The increased air velocity reduces potential static pressure, and may be so high that sufficient static pressure to deliver adequate volumes of cooling air up through the floor may not develop for 9 m to 12 m beyond the point of fan discharge from the CRAC unit 16. This results in insufficient static pressure close to the CRAC unit 16 to move the available cooling air up through the floor grilles 2b. Worse still, in some cases, heated room air is actually sucked down into the floor void through the grilles 2b, reducing the cooling capacity of the cooling airflow and creating 'hot spots'.

The objective of hot and cold aisles is to separate the source of cooling air from the hot air discharge which returns to the CRAC unit inlet. However, in practice, such physical separation is difficult to achieve in an open room environment particularly where high heat loads are concerned. Close-coupled rack cabinets each provided with extract fans create a 'chimney' effect to pull air from the raised floor up through the cabinet and the equipment therein. Too often, however, these fans exhaust more air than the CRAC units 16 can deliver, thereby overwhelming their cooling capacity. Also, excessive suction created by these rack cabinets 11 causes heated air from the room 1 to be pulled into the floor void 6 and then up into the rack cabinets 11. There is just not enough cold air from the CRAC units 16 to satisfy the overwhelming quantity of air exhausted by the rack cabinet fans. Some studies have revealed that bypass air problems typically limit CRAC units to less than 35% of their 'nameplate' rating. In 'hosted' environments, close-coupled rack cabinets have earned the title 'bad neighbor devices', in that they take more than their share of the available cooling airflow.

Orientation of the CRAC units 16 in relation to the rows of rack cabinets 11 is not significant at low loads with a clear floor void 6. However, as cooling loads or cabling and other sub-floor obstructions increase, their orientation becomes significant. Ideally, the CRAC units 16 should be orientated such that their airflow is perpendicular to the rows of rack cabinets 11, as placing them parallel to the rows of rack cabinets 11 will tend to create hot spots. This orientation of the CRAC units 16 may place an ultimate limit on total cooling capacity. For example, two out of four wall surfaces in a room may be available for locating the CRAC units 16, the longest of which are approximately 2.4 m wide, with a capacity of approximately 100 kW. Placing more CRAC units 16 on the other two walls will almost certainly result in disrupted airflow/turbulence. More CRAC units 16 can be added within the body of the technical space (which will typically be the case in wide data rooms) but this inhibits data rack layout flexibility.

Humidity should be maintained at a level that avoids static electricity problems. However, to provide stable humidity, it is not advisable to equip each CRAC unit 16 with a humidifier. Slight drift in humidity sensor calibration may cause a CRAC unit 16 to add humidity while an adjacent CRAC unit 16 is simultaneously trying to dry out the air.

This fails to provide a stable environment and pours significant energy down the condensate drain, increasing risk, maintenance, repair and capital costs. Rather, good practice suggests that a centralized system for humidification should be used, which is usually the make-up air system for the room space. If the chilled water temperatures are too low, this shifts cooling coil performance toward dehumidification and lowers cooling capacity.

Those skilled in the art will appreciate that individual CRAC units cannot share load with their adjacent or opposing partners and in most situations the temperature gradient varies widely due to the variety and capacity of the items of heat-generating equipment as well as their operational state at any given moment in time.

Once cooled air has been delivered through the floor void 6 and into the room space 1, that airflow enters the rack cabinet to cool the equipment housed therein. Conventional rack cabinets have perforated doors front and back to allow through airflow front to back. This through airflow is achieved by the combined action of: air being drawn through by small fans associated with the equipment itself; air being drawn through by fans associated with the cabinet (e.g. mounted at the top, bottom, middle etc.), if fitted; forced convection from the raised floor perforated panels or grilles; and/or forced convection directly into the bottom of the cabinet.

Perforated doors may work satisfactorily at relatively low heat loads but, with high density loads, the doors themselves offer resistance to the desired through flow. While cabinet fans can help to eliminate the hot spots that tend to occur at the top of the rack cabinet 11, care has to be taken in sizing these fans in relation to the through airflow. Tests have shown that the cabinet fans can set up a strong 'chimney effect' airflow pulling the air out of the top of the cabinet 11. This primary airflow entrains the room air at its boundary, increasing the mass of moving air while reducing its velocity. This tends to set up secondary circulation and reduce the through flow into the equipment itself.

Mention has already been made of the problem with air from the perforated floor panels or grilles being of such a velocity as to pass over the cabinet 11 and into the hot aisle. Conversely, lack of velocity can result in a cooled air supply stopping less than half way up the cabinet 11 and therefore not reaching equipment at higher levels. This equipment will rely on cooling provided by the room air which is drawn through by the equipment fans, which room air may itself already be heated and of limited cooling capacity.

Forced convection directly through the bottom of the cabinet 11 may result in similar problems to those noted above. However, additionally, if the rack 9 is heavily populated, then the incoming air strikes the base of the first server and may be deflected out of the cabinet 11 through the perforated doors both front and back. This wasted cooled air then mixes with the room air. During tests using standard industry rack cabinets with forced ventilation through the cabinet base full of 1U high density servers, it was found that the temperature gradient at the rear of the rack became inverted with the highest temperatures recorded within 150 mm of the base of the cabinet. This was largely due to the incoming chilled airflow being forced directly out of the cabinet by the lowest servers and back into the room 1.

In general, conventional rack cabinets are rather 'leaky' not just externally but also internally: for example, many have gaps between the rack itself and the cabinet enclosure allowing cooled air to bypass the equipment within the cabinet and be wasted.

Currently, good practice dictates that due account is taken of individual cooling requirements when arranging the deployment in a rack cabinet, especially to avoid placing very hot devices below equipment with lighter heat loads. Even where this practice is followed, rising heat will tend to result in an accumulative heat build-up progressively towards the top of the rack cabinet.

The majority of rack cabinets are never full of hot devices, up to 40% percent occupation density being typical. Sometimes relatively high loads are possible within standard cabinets—perhaps up to 5 kW. However, upon examination, this is usually due to the load being created by relatively few devices. For example 5 kW of aggregate cooling load from two items of equipment with plenty of air space between them is very different from 5 kW of aggregate cooling load from a full rack of hot equipment. Also, equipping the server itself affects the resistance to airflow. For example, a server fully equipped with network cards might offer 64 pascals of resistance while an otherwise identical but less equipped server might offer only 20 to 30 pascals of resistance. Further, the loads of adjacent equipment directly impacts cooling capacity.

If one considers that a raised floor is effectively a supply air duct and that the length of a typical data room is considered as the duct width (say 37 m) and a room area of approximately 1000 m2 (27 m×37 m) is taken as an example, then taking the averaged loads across the room:

(a) for a floor void height of 600 mm, and a heat density of 2000 W/m$^2$, the duct should be 108.9% of the room length;

(b) increasing the floor void height to 800 mm for the same heat density results in the duct being 81.9% of the room length; and (c) if the floor void is cabled out, reducing its effective depth to only 300 mm, then the duct should be 218.1% of the room length. Put another way, the maximum achievable heat density is less than 2000 W/m$^2$ (108.9%).

Further if one considers the maximum floor space that can be occupied by active IT hardware (rack cabinets) in the above scenario (typically between 30 and 35 percent allowing for all white space such as service clearance, access aisles etc.) and a rack cabinet footprint of 0.54 m$^2$ (0.6 m×0.9 m), then each cabinet can provide between 3.6 kW and 3 kW of cooling capacity. This is a theoretical capacity with a completely free floor void: more realistically, with cabling in-situ, this figure will drop to between 1.8 kW and 1.5 kW per cabinet.

Using the same scenario, consider the total available cooling load from correctly oriented CRAC units. Assuming access and fire exit doors are allowed for (one per side, 1.2 m wide) then a maximum of 14 CRAC units of 100 kW capacity can be located on each side. Assuming a minimum availability of n+1, then a total of 26 CRAC units are available for a load of 2,600 kW. This equates to 2.6 kW/m$^2$ or 4.68 kW to 4 kW of cooling capacity per cabinet. However, to be able to deliver this capacity, the size of the supply duct would need to be increased by raising the floor void height to 1500 mm of clear space (i.e. above any cabling also within the floor void, which is impractical for most data centers. Even for new purpose-built facilities, this floor depth presents various technical challenges.

Other factors affecting the movement of airflow within a given space are ceiling and wall topography, such as: surface characteristics; type of surface; downstand beams; surface obstructions; pipework; ductwork; services; wall abutment; placement of supply grilles relative to equipment racks; placement of equipment racks relative to each other; other equipment; and wall abutments.

Predicting the effects of these various parameters with any certainty to achieve an optimized room configuration is extremely difficult. Technology such as computational fluid dynamics (CFD) software can assist greatly but this approach is not, as yet, widely adopted within the industry. Also, to be effective, the computational model requires accurate modelling of all the characteristics of the room, the rack cabinets and the heat producing devices. Many manufacturers do not make available the information necessary to undertake this task.

The result is that while some security disadvantages have been overcome by containment devices which contain electrical equipment and are positioned in an environmentally controlled room, many of these existing installations risk overheating the equipment due to unexpectedly dense levels of deployment and poor or inadequate air extraction and ventilation. Indeed, in some data centers, the doors that are supposed to be closed to provide security are instead left open to assist cooling.

Enclosed cabinets with perforated ceilings onto which fan kits can be attached to aid air circulation through the units are also known, but they are ineffectual in high density applications. These systems still rely on environmentally cooled room air and the cooling effect of the fans is negligible. While fans may help to achieve desirably uniform air flow within the cabinet, considerable care should be taken in specifying fan size and capacity because an incorrectly specified fan can inhibit the general flow of air within the cabinet.

Various solutions have been proposed to assist with issues of conventional data center technology, which is now some thirty to forty years old. These break down into two main approaches: room-level solutions and rack-level solutions.

Room-level solutions begin with 'close coupled' cabinet systems. Essentially these are developments of the existing pressurized floor technology. The individual cabinets attempt to make better use of the supply air by controlling the amount of air entering each unit with a variety of different types of air inlets or dampers. These dampers are positioned in the base of the cabinet, and on the cabinet front, normally low down to take advantage of the coolest level of room air. Some have pre-engineered openings for cables with sealing brush strips to mitigate the effects of unmanaged and unsealed cable cut-outs. Often, bottom air inlets are provided with small fans to assist airflow into the cabinet enclosure, and in some cases fans are also provided in the top of the cabinet enclosure for the same purpose.

Some variants have recognized the limitation on total cooled air supply from the floor void i.e. between 2 kW/m$^2$ and 3 kW/m$^2$ maximum. These variants attempt to use the room air in addition to that from the floor void to increase the total cooling capacity, which is achieved by manually adjustable opening vents in the cabinet front.

Existing room-level solutions do nothing to address several issues with raised floor technology, which include:
  limited total cooling capacity with reasonable floor void heights;
  increasing sub-floor obstructions reducing the airway over time;
  wasted cooling air through poorly-managed cable cut-outs and leaking floors and cabinets;
  lack of or too high a static pressure;
  uneven loading on CRAC units with some under-utilization and some overloaded;
  problems of bypass air;
  uneven temperature gradients across the room space; and
  influence of adjacent items of equipment on each other.

Further, in attempting to boost the cooling capacity by using room air, these solutions assume that a background ambient temperature of around 22° C. is available. For the reasons already given, this is often not the case as room air is heated by recirculated exhaust air. Using fans to pull air through a cabinet requires a careful balance and sizing of fans to achieve the desired through flow with the racked equipment. Strong vertical airflows can be set up which remove much of the cooled air before it reaches the equipment and has the effect of throttling-down the through flow desired and being attempted by the small racked equipment fans. The vents and dampers on these systems normally require manual adjustment which is carried out on a trial-and-error basis. As racks are equipped out over time, adjustments are often not made to the damper settings until there is a problem. Perhaps more seriously, close-coupled systems can draw so much air from the floor void that they exceed the capacity of the CRAC units to supply it, and starve other containment systems of cooling in a prime example of the aforementioned 'bad neighbor devices'.

A different approach is used for 'spot coolers' which, in one example, places a heat exchanger on the rear door of the cabinet, complete with a number of fans. The fans pull room air through the cabinet and the equipment racked therein, into the heat exchanger and then exhaust it back into the room at or near room temperature. The airflow is therefore front-to-back through the racked equipment as required by the majority of equipment suppliers.

The heat exchanger coil is connected via a pipework system to a cooling distribution unit located outside the technical space which, by regulating the temperature and flow of the chilled water in relation to changes in room dew point, helps prevent condensation. The cooling distribution unit is connected to the existing chilled water supply of the building. Between twelve and fifteen heat exchangers can be controlled from one cooling distribution unit, giving a cooling capacity of up to 8 kW per cabinet.

This system has been designed as a 'hot spot cooler' for retrofit situations. The heat exchanger used, however, intrudes into the hot aisles by 150 mm, thereby reducing the width of each hot aisle by 300 mm if used in adjacent opposed rows.

Due to uneven temperature gradients and complicated airflow patterns already discussed, it is a distinct possibility in many data rooms that the room air drawn into the rack cabinet is above the designed ambient temperature, e.g. 22° C. In that case, the air being exhausted back into the room by the cabinet heat exchanger may also be above the designed ambient temperature. In the case of hot aisles where ambient air is at, say, 34° C. (assuming other containment is exhausting into them—the situation one would expect with a retrofit hot spot solution), there will be some cooling of the air in the hot aisle by mixing of cooler air from the cabinet heat exchanger. This may lead to a phenomenon called 'static bypass' which lowers the cooling effect of the CRAC units, creating other hot spots.

While connections are made into the existing building chilled water service, which would not be permitted in some data facilities, this system has the advantage of allowing progressive build-out. Provided that care is exercised in positioning relative to other equipment, it provides a good technical resolution over conventional technology with regard to equipment cooling, albeit limited given the heat loads now being encountered. However, the system is 'open loop' and so is still vulnerable due to complicated airflow patterns within a conventional system. Similarly, the equipment in the rack is exposed to the other issues already discussed with conventional open rack cabinet systems, such as dust, moisture, cold smoke damage, security and fire risk.

Moreover, the cooling distribution unit is linked to remote room-mounted temperature and humidity sensors. So, this is a 'centralized' control system rather than a rack-specific control system.

The pipeline supply system connecting the cooling distribution unit to the rack heat exchanger is typically single pipe with a mechanical coupling joining the pipe sections. The type of coupling used is a 'Victaulic style 606' (trade mark) which provides a very high quality joint. However, such a joint cannot be said to be leakproof, and combined with the use of solenoid valve assemblies in the pipe runs, as valves are a potential source of leaks, the pipe system may have leaks, even if dual-piped which is not a standard option. If a leak is detected, an internal purge system pumps the coolant within the coolant distribution unit to a drain.

Another variant of the 'open loop' system is the 'zero floor space' model. One embodiment of this approach locates a heat exchanger at high level above the rack cabinets such that cooled air is washed down the fronts of the individual cabinets. This is a similar action to that of the pressurized floor solution, but in the reverse direction. The airflow passes through the racked equipment due to the action of the internal equipment fans and forced convection from the overhead heat exchanger fans. The exhausted heated air is then drawn back up into the overhead heat exchanger to be cooled and the cycle repeats.

The overhead heat exchanger is connected via a pipework system to a cooling distribution unit located outside the technical space and then to the building's chilled water supply. Once again, this system relies on central control using a remote room temperature/humidity sensor.

Each module of the system is 1.83 m×1.8 m in plan area which covers three conventional rack cabinets and weighs 160 kg when filled with coolant. The units are attached to the structural soffit by threaded rod and appropriate anchors, which means that this solution is not, at least primarily, a retrofit option but for new-build situations.

Each module is 0.55 m high and has between 0.6 m and 0.9 m of clear space between the module's bottom face and the top of the rack cabinets. Any suspended ceiling fitted is located at the same level as the cooling module. The spacing between the modules in plan is varied to suit the room load. If the units were butted together edge-to-edge, this would give a notional 6.6 kW per cabinet of cooling. However, this level would not be achieved in reality as the system is effectively 'open' and subject to all the same room restrictions as for a pressurized raised floor. With edge-to-edge abutment or substantially so, there is insufficient room to install light fittings or overhead cable management (which is increasingly the preferred option among users), either of which would disrupt the airflow pattern if fitted below the cooling modules.

Placing the units edge-to-edge on their shortest sides (to fit cabinet/aisle widths) and, say, two cabinets apart on their longest side would provide a notional 4 kW per cabinet. The real cooling load delivered to the rack cabinets is likely to be just above that provided by a pressurized raised floor. However there is the advantage that the overhead situation does not have to deal with the floor void and room topography restrictions to airflow inherent in the raised floor design. The supply and return air path from rack cabinet to heat exchanger is relatively short, and floor space is saved for use by revenue-generating equipment. The raised floor can be used for static cabling and possibly dynamic cabling can be run overhead although even with spaced-apart modules, cabling along the line of the rack cabinet is not possible at a high level other than directly on top of the cabinets. Nevertheless the spaces between the cooling modules could be used for cable bridges between rows.

The next category of solution is the closed-loop chilled water group which is sometimes described as 'air cooled' systems because only air is used within the rack cabinet itself However these systems are, in reality, a development of the traditional pressurized raised floor technology, in that they rely on CRAC units to transfer the heat from air to water or refrigerant and then ultimately to the atmosphere via external chillers or water towers.

One particular example of this approach, as disclosed in International Patent Application No. WO 01/62060, seals the cabinet and directs the airflow via a front and rear plenum or manifold. Actually the cabinet construction may not truly be sealed because in practice there may be visible gaps in the carcass construction, although there are sealing gaskets on the doors. The air movement is vertical through the front 'supply' plenum, then horizontal through the racked devices and then vertical again through the rear 'exhaust' plenum. A variety of fans are used, sometimes located at the top of the exhaust plenum and sometimes also at the bottom of the supply plenum. This helps to control the airflow through the racked equipment.

The bottom of the supply plenum is connected into the raised floor, which effectively forms the supply duct. The top of the exhaust plenum is connected into the suspended ceiling void which effectively fauns the return air duct. To achieve the function as discrete ducts, the two voids are segregated by vertical barriers. This arrangement allows for a substantial improvement over the normal pressurized raised floor open room return air scenario. A limited number of rack cabinets are directly connected to individual CRAC units forming a closed loop system, thus making far more efficient use of the cooling air available from the CRAC unit. The supply air is delivered at 13° C. while the return air is expected to be 34° C. to 35° C. This compares with a conventional pressurized floor open room scenario of supply air at 13° C. and return air between 22° C. and 24° C. Thus, it can be seen that the closed loop system has a Δt of 22° C. as opposed to the conventional system Δt of 11° C. The principal advantage put forward for this system is that by doubling it, it is possible to reduce the required airflow of cooled air to the rack cabinets. This in turn means the CRAC unit fan requires 50% less power to drive the airflow and thus substantial energy savings are possible. However, this figure assumes that system losses do not reduce this saving even though it is still proposed to use the raised floor for cabling, and other factors such as leakage through the floor tiles. Similarly, a suspended ceiling is not a largely unobstructed duct normally used for ducted air supplies so, again, resistance to airflow and leakage within and from the ceiling is likely to impact on these figures.

Also, with this approach, in a retrofit situation, it may not be physically possible to install a suspended ceiling due to the amount of overhead service obstructions already existing. Additionally, installing a suspended ceiling in a live data center may not be acceptable i.e. drilling into the structural soffit to fix the suspension hangers and so on.

This system still has stack or chimney effects inherent to all vertical airflow systems, requiring very careful management of the deployment of heat-generating devices. While loads of up to 8 kW of cooling are claimed for this solution, this may be difficult to achieve in practice, even assuming the greater fundamental efficiency due to the higher At. Test figures have apparently been based on equipment nameplate ratings or alternatively using heater bars. Real figures can be a third of nameplate ratings under real running conditions. Also, while the use of heater bars is the most common industry approach to testing, this takes no account of the variation of heat dissipation across electronic devices or their resistance to airflow—typically 20 pascals for a near-empty server or other device and up to 64 pascals for one full of network cards. Fully-ducted systems of this type utilizing discrete ductwork and well-sealed cabinets can achieve cooling loads of up to 12.5 kW. However there are limitations on the depth or length of cabinet rows due to air velocity factors—testing has indicated this to be at around 20 standard cabinets (600 mm wide).

Another issue with of this approach from a user's point of view relates to the lower airflow. Original Equipment Manufacturers (OEMs) design their equipment such that small fans sometimes combined with heat sinks move the heat away from the critical components and up into the through airstream. Additional fans, sometimes as many as eight, pull air through the device to exhaust the heated air at its rear. An OEM's products can be damaged by too high an airflow; especially, it is possible to 'windmill' or cycle the small fans beyond their self-driven revolutions and shorten their life or indeed burn them out prematurely. Overcooling can also prejudice the correct operation of a device. On the other hand, too low an airflow can result in local overheating.

The heat levels across a device are not even, some regions being significantly hotter than others. Each manufacturer has varying inlet temperatures for its equipment. However, in most real data center situations there is a mixture of products from different suppliers, or different models from the same supplier in any given rack. Therefore, from a practical viewpoint, a compromise airflow is provided that covers the spread of inlet temperature requirements and variations experienced across the devices. For this reason, the major OEMs have expressed concern regarding any cooling method which intentionally reduces the airflow significantly. Their preference is to tend towards higher airflows as this is more likely to ensure safe operation, rather than move to lower flows.

As with some of the other systems discussed, the control function on these products is effected centrally. The cabinet enclosure is, as already noted, leaky especially if the enclosure is a single-skin construction, especially if not insulated. Consequently, should it be possible to achieve real cooling loads above 5 kW and perhaps up to 8 kW with this equipment, then there will be an impact on adjacent equipment. In general, other neighbouring hot devices are likely to impact on the environment in a given cabinet. While this system includes door seals, the overall cabinet construction does not appear to meet any recognized standard of 'sealing' classification.

The next group of products fall under the generic grouping of 'sealed closed loop air to water category self-contained'. Put simply, the heat exchanger is contained within the rack cabinet itself. Embodiments of the disclosure fall within this category but at least one other example is also currently within the market. This unit, the subject of U.S. Pat. No. 6,506,111 issued Jan. 14, 2003, has a segregated supply and exhaust airflow system comprising two plenums—one at the front of the racked equipment and the other at the rear. This is in common with other units discussed previously.

The whole unit stands on a plinth which contains the heat exchanger coil and fans. Heated air from the rear of the racked equipment is drawn downwards through the plenum and into the plinth. The fans push the air through the heat exchanger coil and up into the plenum in front of the racked equipment, through the equipment and back into the rear plenum to begin the cycle over again.

To overcome the stack or chimney effect inherent in any vertical airflow system, various distribution devices are incorporated into the front plenum. The first of these comprises a fiat plate containing a plurality of pre-formed regular apertures.

These apertures increase in number from the bottom to the top of the plenum and thus allow the air to flow through them into the racked equipment. The pattern of the holes can be varied to suit the load with the intention of delivering 'approximately' equal airflow to all levels of the racked equipment. It is also possible to have louvres fitted to the apparatus to provide further airflow adjustment, presumably in a manual operation.

Another distribution device option comprises a solid panel with a raised side along its two long edges and a curved roll-overtop mounted on the back of the front door of the rack. The panel is tapered in its depth such that it reduces the cross sectional area of the plenum progressively from its bottom to its top. This again is designed to provide even airflow through the racked equipment, in a manner similar to the progressively-reducing section found on any run of heating, ventilating and air-conditioning (HVAC) ductwork. Further it is proposed that the same device can be fitted in the rear exhaust plenum or in both plenums. How successful this system is in providing even airflow across all racked equipment is not known, but it would seem that the current levels of cabling required might be obstructed by these devices in high-density applications.

Multiple fans are provided for redundancy although it appears that it is necessary to 25 withdraw the complete fan tray to replace a failed fan, with the consequence that airflow is interrupted while this takes place. With high-density applications, even a short period while a fan is swapped out could have serious implications for the racked equipment. Similarly the heat exchanger coil is described as either single, which is not resilient to the minimum requirement of most data centers for 'n+1' unless hot swappable, or multiple. The multiple option would provide resilience although if it is necessary to pull the two coils out together to swap out the defective one there does not seem to be any point in a multiple coil arrangement. Perhaps this is the reason that the production units are only equipped with a single coil.

The system of U.S. Pat. No. 6,506,111 has the benefit of removing heat from the racked devices close to where it is generated, and of directing the airflow. This also allows relatively high heat loads to be dealt with—currently up to 10 kW per cabinet is claimed. A raised data room floor is not necessary and the position of the heat exchanger means that small footprint dimensions are achieved, albeit with a loss in rack height (the current variant is 40U). The items containing coolant are located low down in the plinth reducing potential damage from leaks, although no means of leak containment seem to be provided. Although described as a sealed system, this refers to 'close fitting' panels' (single skin non-insulated) and not a recognized seal standard or rating—thus the cabinet can only be used in data room environments and is subject to dust, cold smoke, water etc. penetration. External chillers and interconnecting pipework are required.

The final group of known products are sealed closed loop air to refrigerant systems which exhaust the extracted heat into the surrounding space. These systems are substantially autonomous, but most suitable for use in low (or at least not high) density environments where the hot exhaust air will not add to problems for other equipment. However, although some of these products are sealed to a recognized standard, they do not have any means for safeguarding the internal environment where the external environment is not benign, such as conditions of high humidity, partial pressure problems and so on. Some models have the self-contained package unit mounted externally on top, or on the sides of the cabinet. Other variants have it located in the bottom of the rackable area. Cooling capacity tends to be limited with these products, ranging from 1.5 kW up to 4 kW. A condensate drain is required with these products; excessive opening of doors or poor seals can cause continuous drainage of condensate. The room in which these products are located needs to have adequate air circulation to ensure the heat exhaust is rejected to avoid the cabinet overheating.

Examples of such cabinets are currently sold by Liebert Corporation under the name 'Foundation' and by Stulz GmbH under the name 'CT Cooling Rack'. All trade marks are acknowledged.

Liebert's 'Foundation' is aimed at small offices rather than data centers. Essentially, it is an enclosed cabinet, which may be sealed, with locks on the outside of the cabinet to prevent tampering. An internal rack-mounted UPS is an option. Various cooling modules can be employed, for example an internal rack-mounted or external top-mounted 'environmental control module' that cools equipment within the cabinet by using ambient air to remove heat from the inside of the cabinet through an air-cooled condenser. This of course takes some of the space that could otherwise be devoted to servers, if their heat generation problems could be overcome. Warm air is exhausted near the bottom of the unit.

Other cooling options are a fan that can be mounted inside the cabinet to promote air circulation in the cabinet, and a back-up cooling module which responds to excessive internal temperature by circulating filtered ambient air through the cabinet. Another cooling option is a ceiling-mounted fan for ventilating a confined space outside the cabinet, heated by warm air from the cabinet. Units within the rack cannot be upgraded without shutting down the entire unit.

The Stulz 'CT Cooling Rack' is a cooling system for electronic enclosures that can be fitted onto existing cabinets, and is mainly directed to the PABX market in telecommunications. The cooling system is also available with a cabinet comprising three sides and a glass door, with the cooling unit situated on top of the cabinet. Air inside the cabinet is cooled by ambient air that is drawn through a heat exchanger in' the cooling unit and is then circulated within the cabinet. Again, an internal rack-mounted UPS is an option.

Neither of the Liebert or Stulz products is able to achieve the degree of cooling required by a fully-filled 42U-plus cabinet in a large data center. Also, while their localized cooling provisions go some way toward reducing the contamination and inefficiency issues of whole-room cooling, they still have inefficient and ill30 defined airflow within the cabinet. For example, the top-down flow of cold air from top-mounted cooling units goes against the natural upward flow of warm air, and risks condensation problems as moisture in the rising warm air meets the cold downward flow. Moreover, there is still a risk that some servers will receive less cooling air than they should, and that failure of a server's internal fan will result in overheating.

Returning to the power supply issue mentioned briefly, above, redundant engineering is often built into data centers when they are first established so as to allow for future expansion. This inevitably results in waste of money and resources if the data center does not quickly reach its expected capacity. Conversely, if the data center quickly exceeds its expected 'capacity, there is a lengthy lead-time because additional power allocation after initial request from a data center tends to be extremely slow. This is a limiting factor upon the natural growth of the data center.

The result is that tenants usually request more power than they need initially, leading to a scalability problem because power infrastructure needs to be installed for the entire data center from the outset day even if there are only a few tenants at that stage. It would be preferable if there was increased flexibility of adding power to a data center at short notice so that tenants would only need to request extra power as and when required.

Thus, correct sizing of appropriate technology is extremely important. If too much site infrastructure capacity is installed, then those making the investment recommendations will be criticized for the resulting low site-equipment utilization and poor efficiency. However if too little capacity is installed, a company's IT strategy may be constrained, or new services may have to be outsourced because there is no space with sufficient site infrastructure capacity to do the work internally.

Summarizing all of the above, those skilled in the art know that thermal characteristics and airflow movement within a typical data room environment are extremely complicated and, to a large extent, full of uncertainty. As cooling loads increase, this becomes more critical. Conventional cooling solutions can cope up to, say, 2 kW to 3 kW per cabinet, provided that cabling and other requirements are modest. Above this level, it becomes necessary to either spread equipment out widely, which may not be practical or cost effective, or to place restrictive limits on the number of hot devices that can be deployed within a rack. It will be recalled in this respect that a typical maximum deployment density is just 40% of rack space. Currently, such limits are often forced on users due to the action of thermal triggers within the electronic equipment.

It is against this background that the disclosure has been presented.

SUMMARY

In one aspect, the disclosure provides a cabinet for housing a vertical array of heat-producing units, the cabinet having an equipment chamber adapted to support the array such that the array cooperates with the cabinet in use to define a first plenum, the first plenum having an inlet for receiving a flow of cooling fluid and an outlet defined by a plurality of openings through the array whereby the first plenum communicates with the openings in use to exhaust substantially all of the flow of cooling fluid through the openings and hence through the array, wherein the inlet to the first plenum admits fluid to the first plenum in a substantially horizontal direction.

In another aspect, fluid flows across the first plenum in use as a horizontally-moving curtain of fluid that is preferably substantially uniform from top to bottom across the array. This helps to ensure even apportionment of cooling air between all of the heat-producing units such as servers.

The inlet to the first plenum may be a substantially vertical slot beside the first plenum, which preferably extends substantially the full vertical extent of the array or of the plenum.

Advantageously, fluid passing through the array is recirculated for intake to the first plenum. To that end, a second plenum may be provided for receiving the flow of fluid once that flow has passed through the array, the second plenum having an inlet defined by a second plurality of openings through the array, and an outlet.

The outlet from the second plenum may lead the fluid to a plant for cooling and impelling the fluid. That plant preferably includes at least one heat exchanger and at least one impeller. It is possible for the heat exchanger to be either upstream or downstream of the impeller. The plant may further include one or more filters for filtering the fluid before it returns to the first plenum.

The plant may include a single heat exchanger, which is relatively reliable and has less need of redundancy, and a plurality of impellers, which are relatively unreliable and have more need of redundancy. Each impeller may be associated with a non-return valve that closes in the event of failure of that impeller, preventing short-circuiting of airflow through the failed impeller.

For compactness while efficiently promoting the aforesaid curtain of air, the impellers are preferably disposed in a substantially vertical array.

For ease of maintenance, especially where there is no redundancy of equipment, it is preferred that at least the heat exchanger is a module replaceable during use of the cabinet. For example, the heat exchanger may be mounted to the cabinet on runners supporting the heat exchanger when it is withdrawn from the cabinet, and may be coupled to coolant supply ducts by dry-break connectors.

In preferred, compact arrangements, the plant is housed in a plant chamber beside the equipment chamber. Fluid can circulate in use between the plant chamber and the equipment chamber: for example, the flow of fluid through the equipment chamber may be substantially parallel to and opposed to the flow of fluid through the plant chamber. It is advantageous for the general flow of that fluid to be substantially horizontal throughout said circulation. Nevertheless, it is preferred that the general flow of fluid emanating from the plant chamber undergoes a substantially orthogonal direction change to enter the first plenum and that the general flow of fluid emanating from the second plenum undergoes a substantially orthogonal direction change to enter the plant chamber.

At least one door suitably affords access to the plant chamber independently of access to the equipment chamber. Thus, for example, respective doors affording access to the plant chamber and the equipment chamber may have independent locks capable of permitting access to one chamber but not both, so that only suitably authorized personnel are allowed access to each chamber.

In preferred embodiments, each plenum extends substantially vertically between an upright wall of the cabinet and an upright face of the array, and openings through the array are distributed across the face of the array. The openings through the array preferably extend substantially horizontally between first and second plenums opposed about the array. Elegantly, the upright wall may be a door or removable panel affording access to the cabinet.

The cabinet, in one embodiment of the disclosure, is preferably adapted to house units in the form of servers. It may also house or be adapted to house power supply and/or fire suppressant units, and may further include heat transfer means for carrying heat away from the cabinet.

In another aspect, the disclosure provides a method of cooling an array of heat-producing units housed 10 in a cabinet, comprising directing a flow of cooling fluid into a plenum that communicates with openings in the array and confining the flow such that substantially all of the flow passes from the plenum through the openings, wherein the fluid enters the plenum substantially horizontally.

The method may comprise directing the flow across the plenum and/or apportioning the flow substantially equally among the openings. The flow into the openings may be transverse to the direction of flow through the plenum, although the direction of flow through the plenum and the flow through the openings is still preferably generally horizontal.

As before, fluid preferably flows across the first plenum as a horizontally-moving curtain of fluid such that the flow of fluid is substantially uniform from top to bottom across the array, and fluid advantageously recirculates in use within the cabinet with its general flow direction being substantially horizontal throughout said recirculation.

In another aspect, the disclosure provides a data center installation comprising at least one cabinet corresponding to an embodiment provided by the disclosure or operating according to an embodiment of the disclosure. The installation may further include door interlock means preventing access to a cabinet if specified conditions are not met. One such condition is user authority to access the cabinet. Another is environmental compatibility inside and outside the cabinet, to prevent condensation. Another is that an outer enclosure around the cabinet must be closed.

An outer enclosure around the cabinet preferably includes air conditioning means for controlling temperature and/or humidity around the cabinet. That enclosure may be equipped with external panels spaced from walls of the enclosure to shade, insulate and cool the walls.

The cabinet to be described herein achieves energy savings in comparison with conventional equipment rack cabinets, where these are cooled using pressurized raised floor systems in conjunction with close control computer room air handling units (CRACs or CRAHs). The cabinet system permits racks with very different heat/cooling loads to be located adjacent to each other without one affecting the other.

The heat loads generated by electronic devices often vary due to the operational state of the device at any given time. The cabinet system described herein reacts to this by delivering only the amount of cooling that is required at any given moment to the specific equipment in each rack. The system is capable of utilizing all of the rack space for hot devices as opposed to conventional rack/cabinets which are typically limited to 40% of the rack space. The system is capable of dealing with high-density loads of up to 15 kW per rack IT cooling load and beyond.

To maintain a closed environment, the cabinet is preferably sealed to an Ingress Protection rating of 'IP55'. These digits represent resistance to water ingress from light jets of water played onto the cabinet, and resistance to physical ingress from airborne dust. Sealing the cabinet in this way prevents dust ingress which is often a problem in data centers due to ongoing building or maintenance work taking place after the data center begins operation. Sealing also resists water ingress, especially in multi-tenant facilities where some tenants or technicians might carry out activities which result in water spills to those below. In particular, equipment cannot be damaged by water spraying or dripping through conventional perforated doors.

In some embodiments, the cabinet contains all the requirements for a data center environment (environmental/cooling control, fire protection/detection, power management and security) within the cabinet. In its standalone variant, it provides a data center environment for use anywhere, internally or externally. Combined with its modular plug-and-play remote plant, the cabinet of these embodiments provides a truly scaleable solution that can be scaled both upwards and downwards.

The disclosure therefore enables the provision of a physically and environmentally safe and secure environment for locating existing and future IT/electrical critical technology in high-density deployment. High-density deployment in this sense means the ability fully to occupy the rackable area of the cabinet element 100% with hot devices for cooling loads between 3 kW and up to 20 kW per cabinet. Embodiments of the disclosure facilitate this deployment without the user having to be concerned about the relative positions of the electrical equipment within the rack space in regard to thermal performance. In particular, the stack or chimney effect is essentially eliminated due to the horizontal airflow delivery to the equipment.

Due to the close proximity of the water-cooled heat exchanger to the heat source combined with the relatively wide 'air duct', remembering that conventionally-directed forced air systems flowing vertically have a relatively narrow duct, very little heat is transferred by convection to the inner walls of the cabinet. Further, due to the preferred dual skin insulated core construction of the cabinet walls, any heat that is transferred is not conducted across the core to the outer skin. Similarly, heat gain or loss is not experienced from the room side of the cabinet to disrupt the precisely controlled environment.

Aspects of the disclosure address potential 'cold bridging' problems and the quality of sealing: the majority of standard industry containments leak badly, sometimes even those claiming to be sealed. The cabinet will satisfy the 1P55 rating as a minimum (higher ingress protection ratings can be achieved if necessary) and can be considered 'room neutral'. This is particularly important where a user wishes to locate a high-density deployment within an existing environment without causing problems to the existing equipment. This secure environment is provided in a form that permits its use in any location where it might reasonably be required, that is, not only within a data room environment but also in ordinary internal and external spaces such as offices, factories, warehouses, marine applications and on open sites such as may be necessary for military or construction use.

The containment of embodiments of the disclosure will safely house any EIA-310-D 19' rack mounted product with front to back ventilation including blade servers, from any vendor or OEM. The system architecture is designed to provide a minimum of n+1 redundancy for the service housed and high availability and fault tolerance. For example, components more likely to fail under risk analysis are designed to be 'hot pluggable'.

Automated control systems minimize the requirement for human intervention which depending on the research considered can account for up to 40% of downtime. The control systems are designed to provide proactive remote monitoring and control to minimize the opportunity for unforeseen failure.

The system architecture provides true scalability both upwards and downwards, allowing users to match current real needs with appropriate levels of secure provision rather than over-engineering on the basis of what will be needed or might be needed at some future date.

Attempting to achieve energy efficiency with a room-level system presents a number of difficulties. For example, the delivery path for cooled air for example in a pressurized floor solution is subject to numerous variables, such as under-floor obstructions, room surface topography and widely varying equipment loads across the room. A lengthy air path from plant to containment and return to plant, depending upon the particular system used, risks inefficient use of the central plant, e.g., chilled air bypass, loss of static pressure and too high a static pressure. By shortening the distance from the source of heat generation to the point at which heat is transferred via convection to a denser medium than air, and limiting the volume of the technical space to be cooled (down to cabinet level) it is possible to deal efficiently with very high heat loads.

Embodiments of the disclosure provide a pre-configured system where all the interface problems between the elements have been dealt with and incorporated into a single system prior to delivery to the end user. The provision of certainty rather than the uncertainty of traditional systems allows users to meet their audit needs with ease under corporate governance requirements.

BRIEF DESCRIPTION OF THE DRAWINGS

Reference has already been made to FIG. 1 of the accompanying drawings, which is a schematic sectional side view of a conventional data center having equipment cabinets which are cooled by a close-control room air conditioning unit (CRAC unit) within the technical space.

In order that the disclosure be more readily understood, reference will now be made, by way of example, to the remaining drawings in which:

FIG. 2(*b*) is a sectional view of the cabinet and enclosure taken on line Y-Y of FIG. 2(*a*);

FIG. 2(*c*) is a sectional view of the cabinet and enclosure taken on line X-X of FIG. 2(*a*);

FIG. 5(*b*) is a sectional side view of the cabinet of FIG. 5(*a*);

FIG. 5(*c*) is a sectional rear view of the cabinet of FIGS. 5(*a*) and 5(*b*);

FIG. 5(*d*) corresponds to FIG. 1 but shows the cabinet of FIGS. 5(*a*) to 30 5(*c*) housed within the technical space and replacing one of the cabinets of FIG. 1;

FIG. 6(*b*) is a sectional side view of the cabinet of FIG. 6(*a*); and

DETAILED DESCRIPTION

Figure 1:
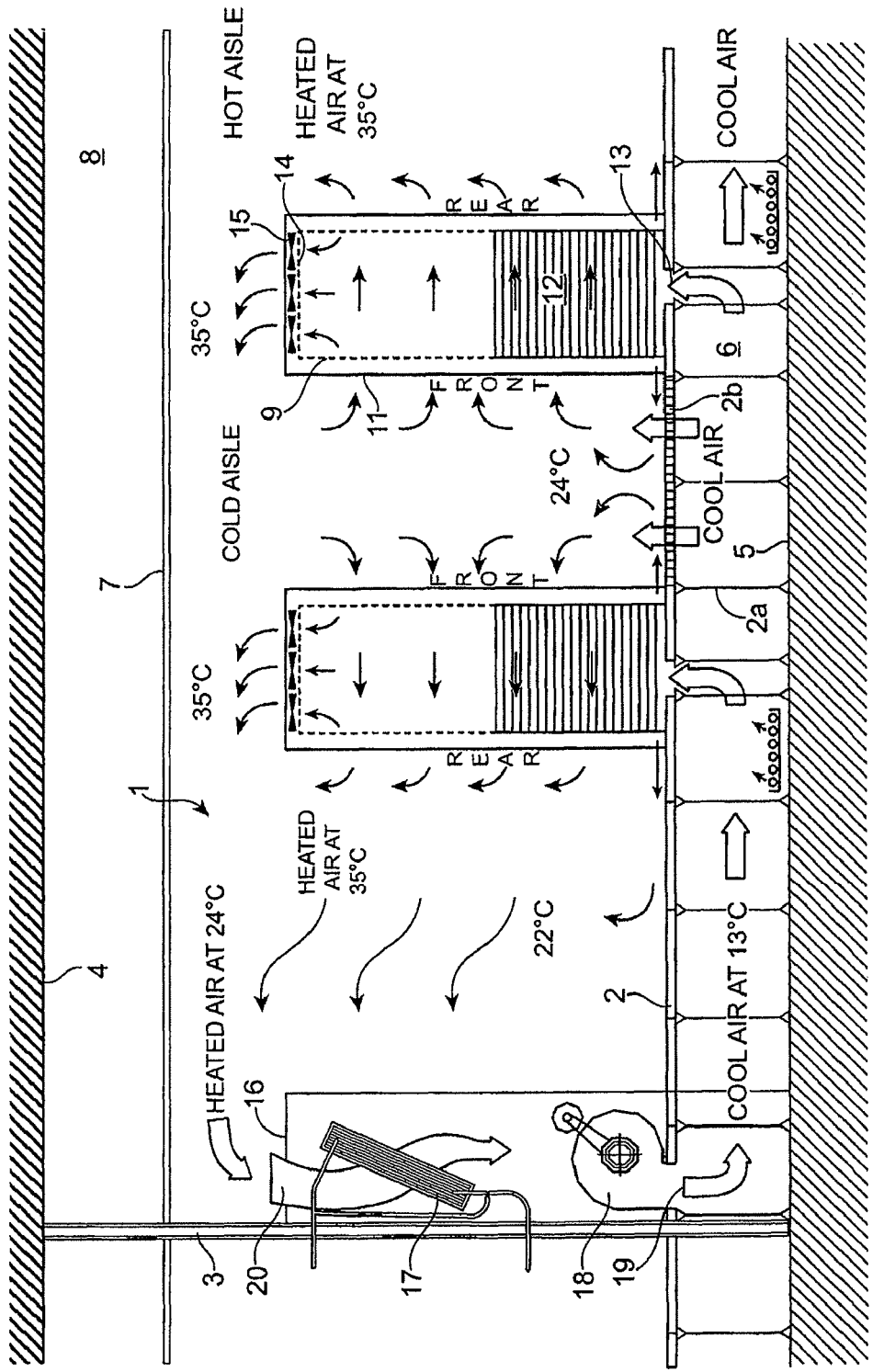

Referring firstly to FIGS. 2(a), 2(b) and 2(c), FIGS. 3(a), 3(b) and 3(c) and FIG. 4, preferred embodiments of the invention comprise three main elements which together enable an autonomous cabinet system 28, in the sense of a data center facility within a single equipment cabinet that does not rely on external service provision other than electrical power and coolant connections. If required, power and coolant facilities can be provided using plant skids which may, for example, include a generator set for the provision of electrical power. Suitably secure mains power connections are of course possible and, in most cases, preferred.

The first element of the system is the equipment cabinet 30 itself, which is sealed from its immediate environment. When used in non-controlled environments 32 as in FIGS. 2(a), 2(b) and 2(c), the cabinet is placed within a secondary outer enclosure 34 which insulates it from the environment and provides a zone where humidity can be controlled by a small package cooling unit 36. An equipment cooling unit (ECU) 38 within the cabinet 30 provides cooling/heating and humidity control and connects by a pipework system 40 to a plant skid 42 (shown in FIG. 4). The door 44 of the outer enclosure 34 is interlocked with the cabinet door via the control system to prevent both being open at the same time.

Figure 3:
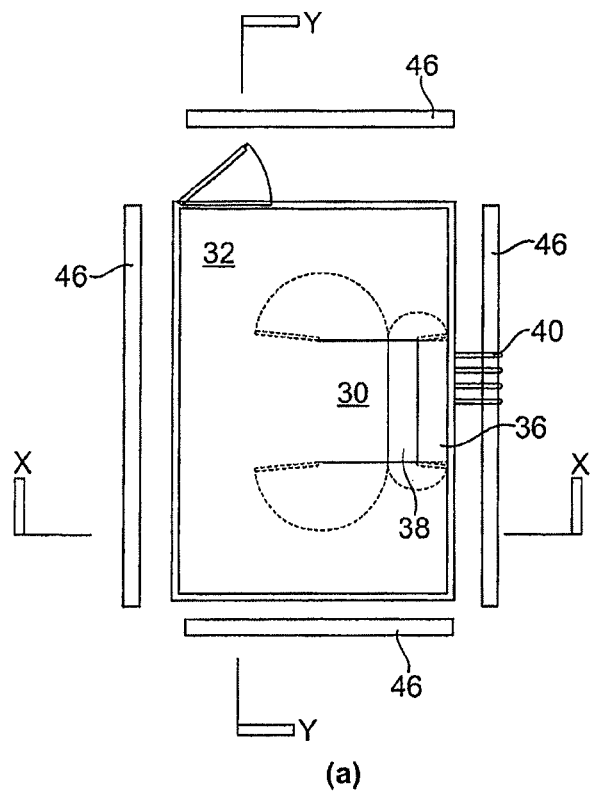
FIGS. 3(*a*), 3(*b*) and 3(*c*) correspond to FIGS. 2(*a*), 2(*b*) and 2(*c*) but showing external environment panels outside the secondary enclosure.
Figure 3:
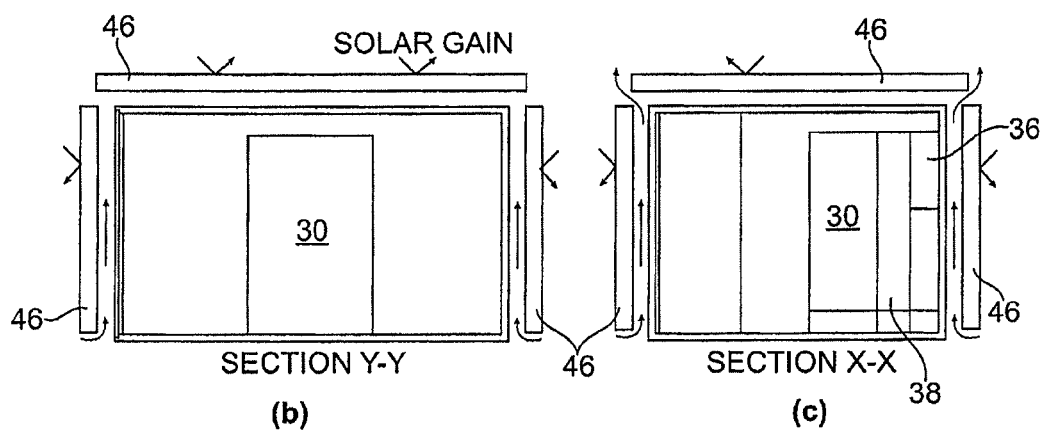

Further, if in an external environment, extra panels 46 may be added outside and spaced from the secondary enclosure 34 as shown in FIGS. 3(a), 3(b) and 3(c). These provide for passive cooling by virtue of airflow through the gaps between the panels 46 and the enclosure 34 and also ensure that the walls of the outer enclosure 34 are in shade conditions. This reduces the cooling required for the outer enclosure space 32.

Specifically, the extra panels 46 reflect direct solar gain and by virtue of the gaps, they also provide a means of passive ventilation/cooling. In the event of solar gain experienced by the panels 46, air heated in the gap between the panels 46 and the outer enclosure 34 creates a chimney/stack effect in which air enters below the bottom edge of the panel 46 and exits at the top edge. Thus, there is a continuous supply of cooling fresh air and exhaust of warm air before that warm air can transfer significant heat to the outer enclosure. Similarly a horizontal panel may provide a through-vented roof cavity. This ensures that the main insulated outer enclosure structure remains in shade conditions reducing the amount of cooling required to maintain a suitable ambient environment.

Figure 4:
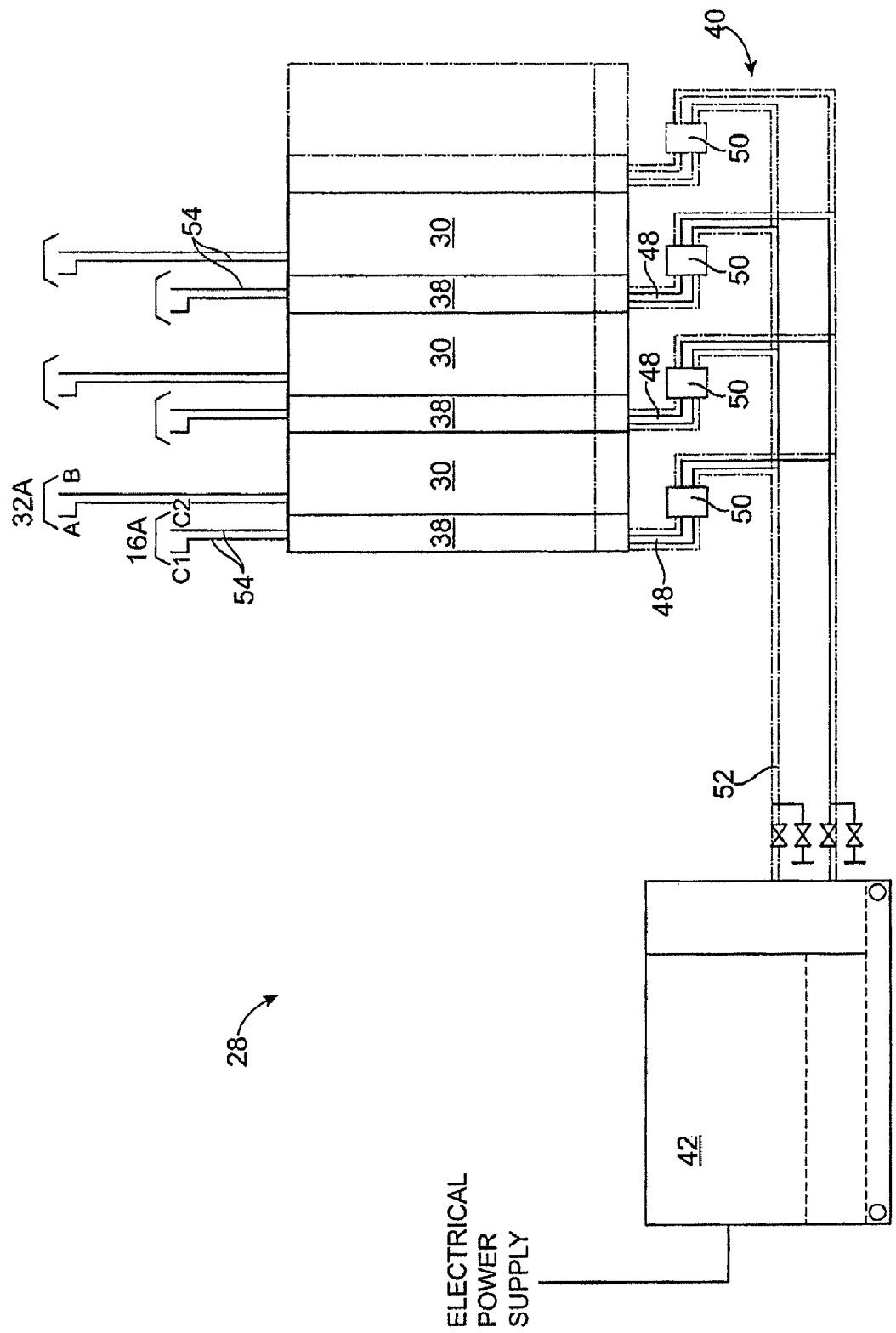
FIG. 4 is a schematic diagram showing the power and fluid connections of a system incorporating cabinets.
Figure 5A:
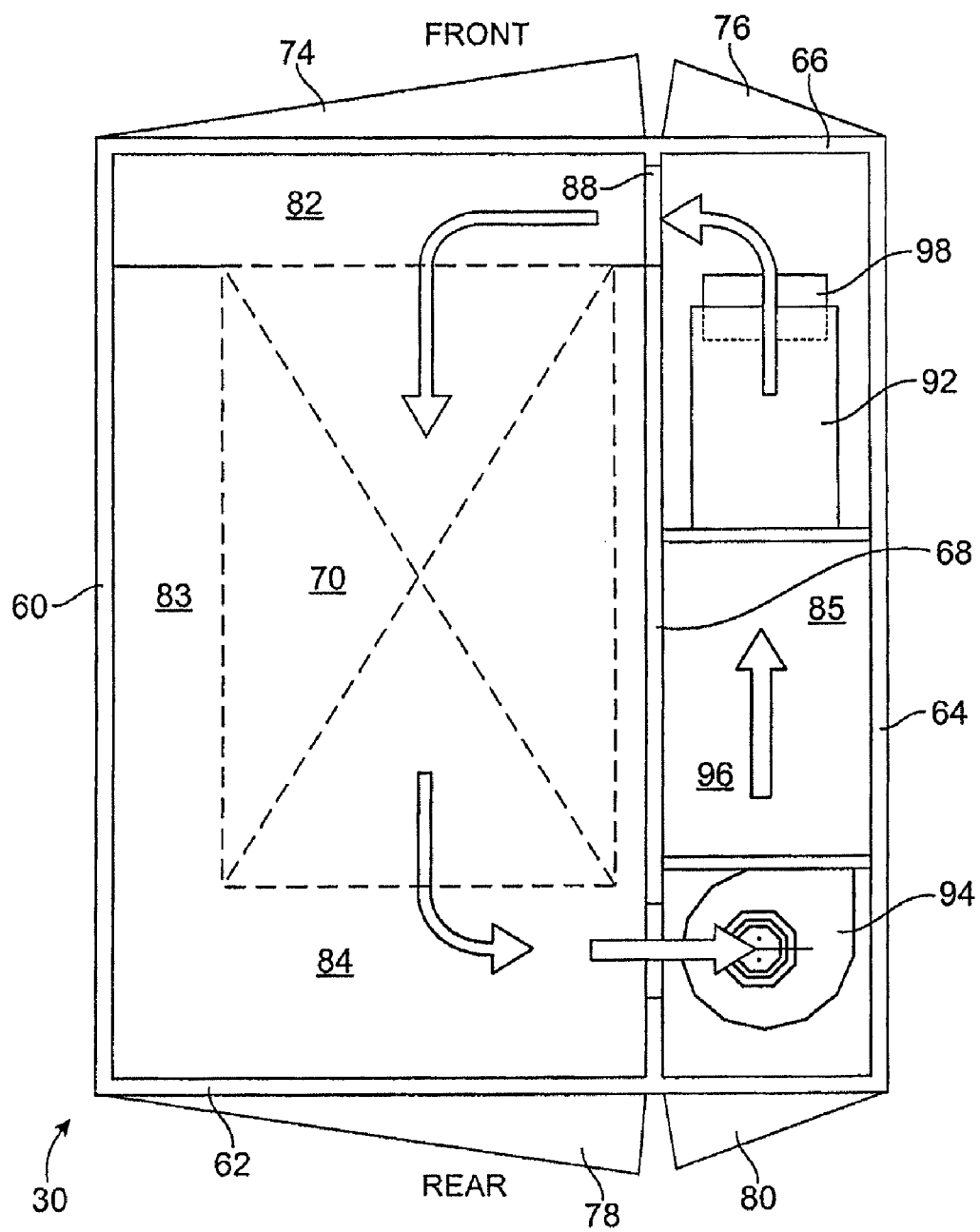
FIG. 5(*a*) is a sectional plan view of an example of a cabinet.
Figure 5B:
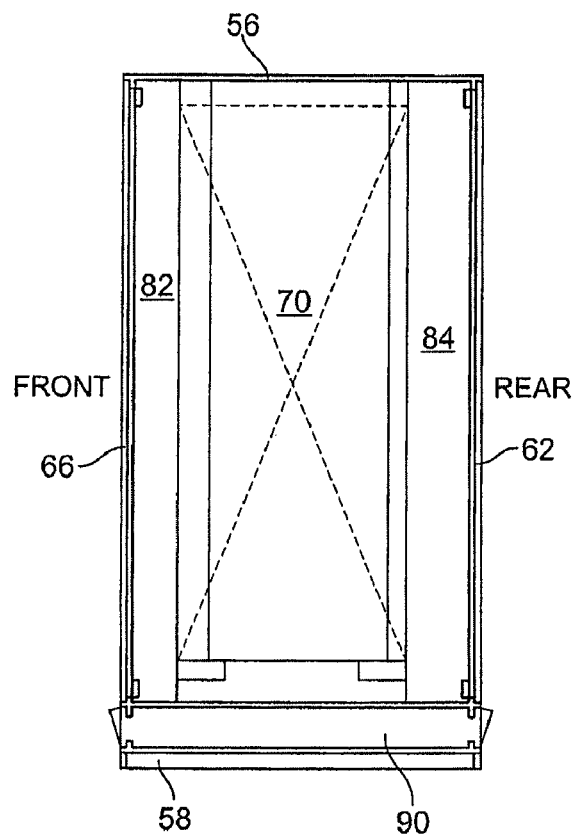
Figure 5C:
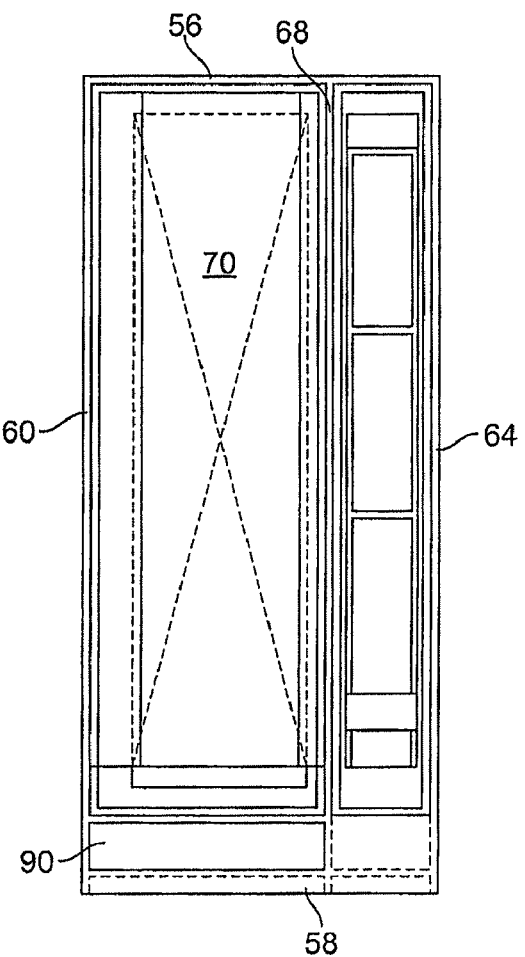
Figure 5D:
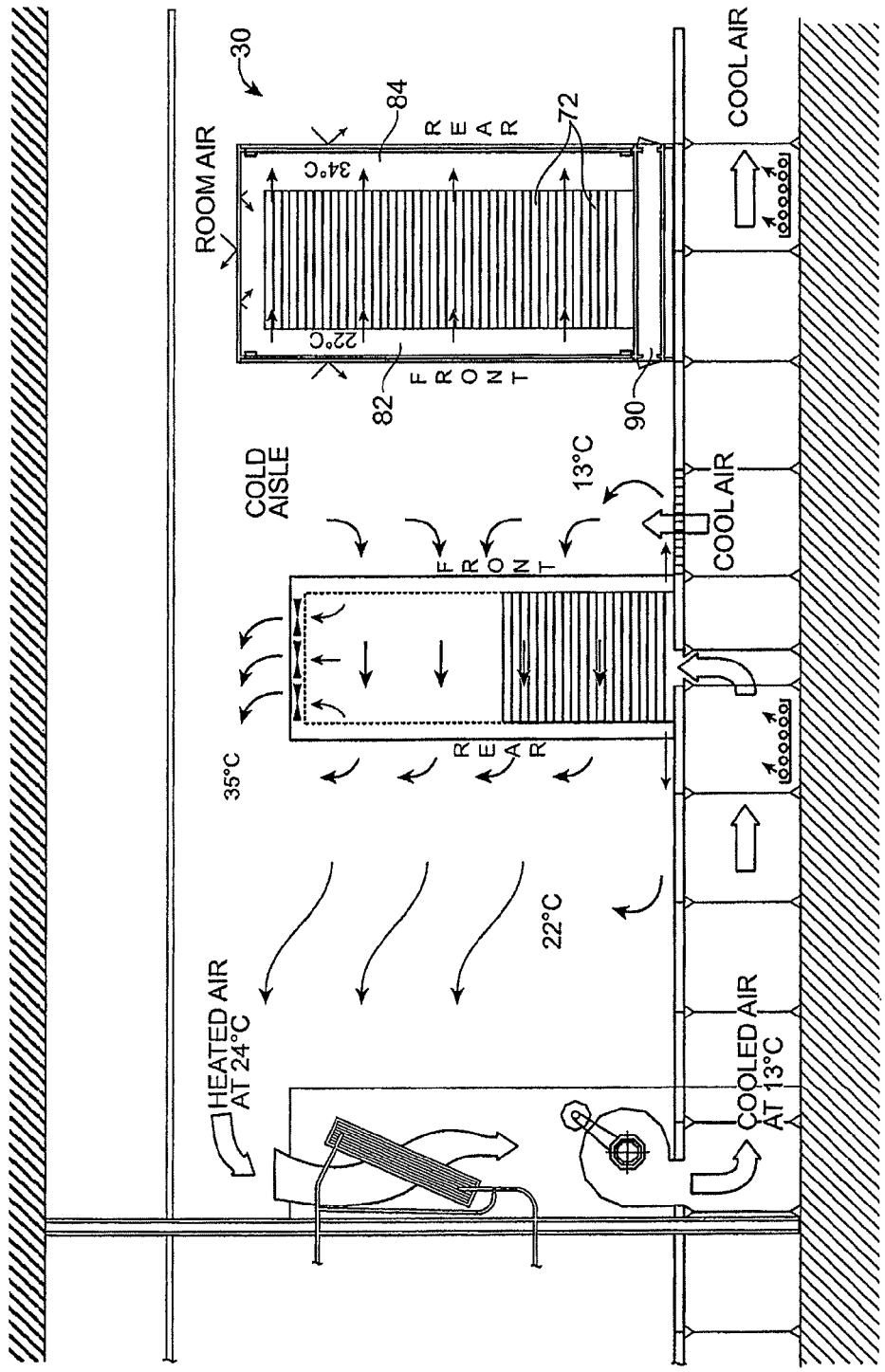

Referring now to FIG. 4 in particular, the second element of the system 28 is the pipework system 40 connecting the cabinet ECU 38 to the remote chiller plant skid 42. This comprises a prefabricated, insulated pipe-in-pipe system to provide maximum protection against leakage. The system 42 can be connected at high or low level to the cabinet 30 via a flexible pipe-in-pipe hose 48. The flexible hose 48 is connected to a valve box 50 which contains flow and return isolating valves (for individual cabinet systems) or a prefabricated commissioning balancing set (for multiple cabinets). Rigid pipe-in-pipe 52 runs from the valve box 50 to the chiller plant skid 42 itself.

The third element of the system 28 is the remote chiller plant skid 42 comprising one of a range of modular skids sized to suit whatever permutations of cabinet numbers are required. Though not shown, each skid 42 is provided with two chillers (providing n+1 redundancy), a buffer tank, a mixing manifold, variable speed pump sets, an actuator and a control panel.

This combination of elements allows for truly scaleable deployment, firstly cabinet-by-cabinet, and secondly by modular remote plant. As cabinets are added in small increments over time, a point will be reached where the multiplicity of remote plant modules will not be sized correctly in relation to the total load to provide maximum efficiency in running and maintenance costs. In the invention, the plant skids 42 which are therefore designed on a 'plug and play' basis can be added into or withdrawn from the pipework system 40 without closing down the service. This allows plant skids 42 to be swapped out at any time in the future, and more appropriate size modules added to maintain maximum efficiency with regard to running and maintenance costs.

In contrast with current data center technology, plants are typically sized for the ultimate total load, which means that the plant may be oversized for periods of sometimes years until the actual load approaches that level. If, conversely, the plant is undersized for the eventual total load, then this may cause disruption to live services requiring upgrading.

In terms of service connections, the cabinet 30 of the invention is carried by the raised floor of the data room or directly by the solid floor of the building as required. Electrical power cables are connected to the cabinet 30 via panel mounted 'commando' plugs located both on the bottom and top of the cabinet 30 to allow either connection from the raised floor void or the ceiling void or other overhead services if a suspended ceiling is not fitted. There are four electrical connections to the cabinet:

(i) 32 Amp A and B 'clean' secured supply to power the dual corded equipment rack Power Distribution Unit's (PDU's);

(ii) 16 Amp C1 and C2 'dirty' secured supply to power the ECU 38. These supplies (clean and dirty) are separated to avoid any possible earth noise problems being transmitted from the ECU 38 to the equipment rack PDU's. The C1 and C2 supplies are run via the rack mounted FPU which contains a 16 Amp circuit breaker which is opened in the event of a fire alarm condition to shut down the cabinet fans. An emergency power off (EPO) link is also run from the FPU to the PDU link boxes to shut down the PDU's in the event of a fire condition. If a transfer switch or rackable UPS is fitted this is also connected to the FPU's EPO.

(iii) Between the A and B electrical inlet plugs and the equipment PDU's two link boxes (A and B) are located in the bottom of the racked space which constantly monitor the RMS voltage, RMS current, and kWh of each PDU. Each of the individual socket outlets (IEC 1OA as standard one socket outlet for each U position of rack space) is remotely switchable (no switches are fitted to the PDU strip to avoid personnel accidentally switching off the wrong service).]

(iv) The link boxes are provided with an LCD display of the instantaneous RMS current, RMS voltage, and cumulative kWh. A 32A Class C Double Pole MCB provides over current protection. A communication port (EIA RS485) is 5 provided for individual socket switching, data input/output and power and a data programming port (RJ45).

There are two chilled water connections onto the cabinet made with 'dry break' connectors and flexible hoses (pipe-in-pipe) 48, either at low level or at high level. The flexible hoses connect to the sealed valve box 50, with the outer hose screwed onto the housing of the box while the inner hose passes through the box to connect to valves therein. The valve box 50 contains either isolation valves (single cabinet) or a balancing/commissioning set (multiple cabinets). Thus those items which might possibly give rise to a leak, namely the valve connections/valve bodies, are contained within a leak-proof enclosure.

A rigid pipe-in-pipe system 52 runs from the other side of the valve box 50 to the plant skid 42. The pipe system 40 is supplied in pre-fabricated format (3 m/5 m lengths) comprising an inner triple layered plastic/metal/plastic pipe to which insulation is bonded. The outer corrugated pipe facilitates pulling back the outer sleeve and insulation to make the pipe joint (either fusion welded or crimped). The joint, is made and a vapor seal collar applied over the joint. Adjustable pre-assembled pipe supports allow fixing of the outer pipe run to the building fabric. Leak detection tape can be provided in the outer pipe linked to the cabinet controller. A buffer tank requires filling with water; but once filled does not require, a permanent cold water feed.

Where it is required (and if there is sufficient cooling capacity) to connect the cabinet system 28 into an existing facility chilled water supply, then it is necessary to provide a plant module to raise the chilled water supply temperature to 11.5° C. before entering the cabinet chilled water main.

The cabinet system 28 can operate as completely stand alone, or have a data connection run from the cabinet controller to a local desktop PC, a local control room, or via a LON Gateway or SNMP to communicate via an Intranet or Internet link for remote access. Similarly, the remote plant skid control panel can be linked to a local desktop PC, a local control room, or via a LON Gateway or SNMP to communicate via an Intranet or Internet link for remote access. The mains pipe-in-pipe leak detection (if fitted, being optional) is connected to cabinet controller.

Referring now to FIGS. 5(*a*), 5(*b*), 5(*c*) and 5(*d*), the cabinet 30 of the invention is generally cuboidal and is constructed largely of rectangular steel panels which may be structural, although the cabinet 30 may also have an underlying structural frame to which the panels are attached. The panels define parallel horizontal top and bottom walls 56, 58 and parallel vertical side walls 60, 62, 64, 66 extending between the top and bottom walls 56, 58. A vertical partition 68 extends parallel to the side walls, also between the top and bottom walls 56, 58.

Figure 2:
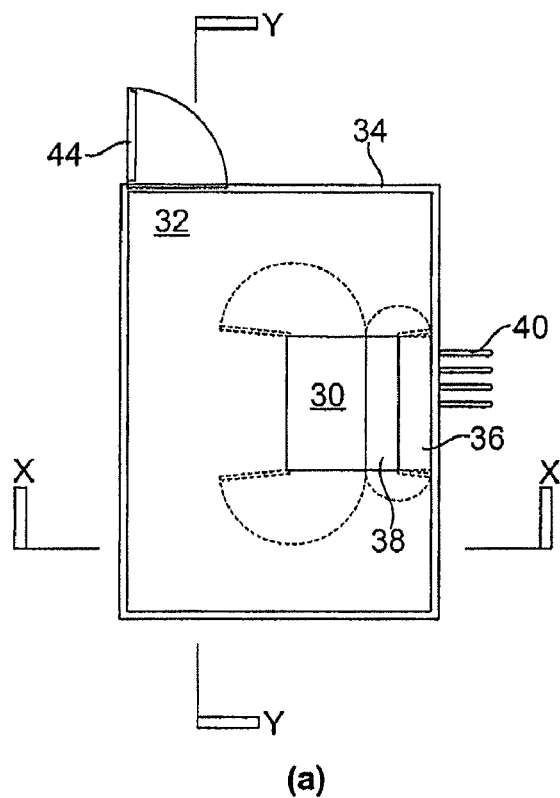
FIG. 2(*a*) is a sectional plan view an example of a cabinet in a non-controlled environment, thus equipped with a secondary enclosure.
Figure 2:
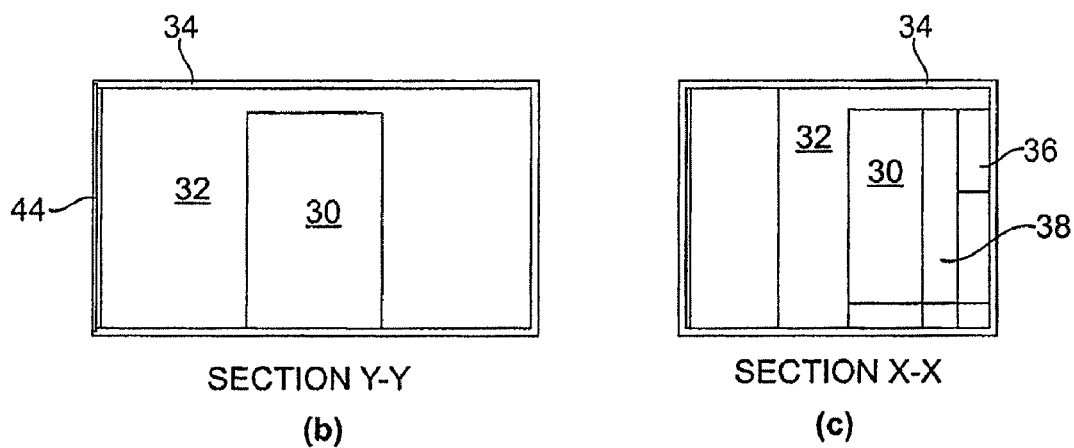

The cabinet 30 comprises two main parts divided by the partition 68, namely a rackable equipment space 70 beside an equipment cooling unit or ECU 38 (FIG. 2(*a*)). In other words, the partition 68 within the cabinet 30 defines a server chamber 83 for racking beside a plant chamber 85 for impelling and cooling air to pass through and between servers in the racking.

The partition 68 does not extend to the full depth of the side walls 60, 62, 64, 66 or the top or bottom walls 56, 58, therefore leaving gaps or slots at the front and rear of the partition. These gaps or slots provide for recirculating airflow between the server space and the plant space, via a front supply plenum extending over the front face of a bank of servers supported by the racking and a rear exhaust plenum extending over the rear face of that bank of servers.

The invention therefore contemplates a cabinet carcass forming two internal areas; an equipment rack space 70 and an ECU space. Advantageously, the part of the carcass defining the ECU space is removable from the part of the carcass defining the rack space 70 to allow for easier installation access in existing buildings with limited door opening width. However, this is not essential to the invention in its broad sense.

The carcass has a double-skin construction to reduce weight, provide structural integrity, reduce noise transmission, reduce thermal transmission and increase security. The carcass may be constructed from any of a variety of materials to best suit specific applications, or a combination of them, for example steel, aluminum or plastic skins with mineral wool filling, aluminum honeycomb, high density foam or synthetic honeycomb cores.

The cabinet 30 contains racking 72 defining bays capable of accommodating a corresponding number of 1U units such as servers. Of course, deeper units of 2U or more in thickness can be accommodated if the overall number of units in the cabinet is decreased. The units are positioned close together in a layered stack-like configuration, although the units are supported from the sides of the cabinet and are not actually stacked in the sense of resting upon one another. This means that units can be removed and replaced without disturbing adjacent units above or below.

Some capacity in bays at the bottom of the cabinet 30 may be devoted to an electrical power management unit such as a UPS and a further capacity in bays at the top of the cabinet may be devoted to a gas fire suppressant unit. This leaves the remaining capacity for other units such as servers protected by the power management unit and the fire suppressant unit.

The fire suppressant unit may, for example, be a gas dump unit containing heptafluoropropane suppressant, as is commonly sold under the trade mark FM200 of Great Lakes Chemical Corporation and known generically as HFC-227ea. Gas dumping can be triggered by a smoke detector such as is sold under the trade mark VESDA of Vision Systems' Group.

In conventional manner, each server within the cabinet 30 defines an airflow path between ventilation openings such as grilles in its front and rear faces, which openings may be referred to as front ventilation openings and rear ventilation openings respectively. There may of course be other openings in the top, bottom or sides of servers. Each server typically also includes an impeller to promote cooling airflow along that path around heat sources within the server.

It will be apparent that each cabinet 30 defines a sealed environment that, in emergency situations, has an important element of self-sufficiency in terms of cooling, fire protection and power supply. To that extent, each cabinet 30 is a mini data center that is apt to be retro-fitted to an existing site, and that can be filled to its maximum capacity without overheating as will be discussed in more detail later.

Access to the interior of the cabinet 30 is via four doors, two on the front 74, 76 and two on the rear 78, 80. One door of each pair 76, 80 gives access to the ECU 38 and the other door of each pair 74, 78 gives access to the equipment rack. The doors are side-hinged and sealed around their periphery. They may be glazed although that is not technically significant.

The doors 74, 78 giving access to the equipment rack 70 are spaced from the front and rear of the server units so that in conjunction with the side panels 60, 66 and the partition 68, they create a front supply plenum 82 communicating with the front ventilation openings of the server units and a rear exhaust plenum 84 communicating with the rear ventilation openings of the server units.

The rear exhaust plenum 84 is closed to all sides but one, where it communicates with the plant chamber 85 through a gap or slot 86 at the rear of the partition, thereby to exhaust air that has been warmed by its passage through the server units. That air is cooled, filtered and impelled through the plant chamber 85 into the front supply plenum 82 via a gap or slot 88 at the front of the partition. Like the rear exhaust plenum 84, the front supply plenum 82 is closed on all other sides.

Substantially all of the incoming air must pass through the front plenum 82 and from there through the front ventilation openings of the servers. To ensure this where the cabinet is not full, blanking plates should be fixed across any bays not occupied by servers; otherwise, air would flow preferentially through the resulting gaps, around rather than through the servers.

Each door 74, 76, 78, 80 is lockable by electric (preferably magnetic) door locks under smart card control, to which end a smart card reader (not shown) is provided on the front and rear of the cabinet. Smart cards may be programmed to give access to either the ECU doors, the equipment rack doors 74, 78 or all doors depending on the duties of the personnel issued the card. Additionally, cards can be programmed to operate the access doors to the room where the cabinet 30 is located and all the other access doors en route to it.

At the base of the cabinet 30, a secure drawer unit 90 houses programmable control systems that operate the system 28. However, this positioning is not essential: other variants or models may locate the control system elsewhere, for example within the ECU space or door mounted. Whatever the position, the principle is the same in that access to the controls is possible without having to enter the rackable space 70.

Where different personnel maintain the ECU/controls and the rackable space, neither must have free access to the other's area of responsibility to avoid operational/maintenance incidents which might result in downtime. Consequently, upon presentation of the smart card to the smart card reader, the programmable controller inside the cabinet 30 checks with a security record that the user is authorized to enter the cabinet.

Having confirmed this, the controller then uses sensors to check the external and internal environment, which should be similar although the cabinet environment is more precisely controlled. If there is a discrepancy between the external and internal environment that could result in a dew point problem when the doors are opened, then the electric door locks are not released. Otherwise, room air can deposit moisture either within the cabinet 30 to be carried by airflow onto the racked equipment or directly onto the racked equipment itself. So, in the event of such discrepancy, a warning is given by a light or buzzer to the person trying to gain access, alerting them that the cabinet environment must be adjusted first.

To harmonize the external and internal environments, the controller may use variable speed fans and chilled water valves to adjust the internal environment to eliminate the problem. Once this has been achieved, the warning indication ceases and the door locks release. Should the external and internal environments be too far apart to harmonize in this manner, then the door locks will not release. The user then has to address the reason for the external data room environment having moved so far outside its specified limits. Should the reason for denying access be due to a fault with the controller, this can be verified via another alarm (general) condition. If this is the case, then it is possible to open the doors with a manual override key which should be held at a separate security point. Manual locks or latches may be provided in addition to the electric locks to ensure that door seals are maintained at all times when the doors are supposed to be closed.

Once the purpose of entry to the cabinet 30 has been completed, the user closes the 10 door(s) and re-presents the smart card which locks the cabinet 30 and puts the ECU 38 into 'soft start' mode. Soft start is used at initial commissioning to bring the internal environment back up to set point over a timed delay (normally 15 to 20 minutes) to avoid any dew point problems with the room air that has been introduced into the cabinet.

The ECU space contains cooling equipment comprising a chilled water coil 92 (heat exchanger) and a vertical array of fans. The relationship between the fans 94 and the coil 92 varies between variants. In the first variant shown in FIGS. 5($a$) to 5($c$), the fans 94 are positioned at the rear of the cabinet 30 and draw air from an exhaust plenum 84 at the rear of the rack space 70. The airflow is then pushed into a middle plenum 96 and then through the coil 92 and filters 98, downstream of the fans 94, to the front of the cabinet 30, where it flows into the supply plenum 82. The supply plenum 82 delivers the airflow to the front of the racked equipment, where it passes through the equipment ventilation holes, collecting heat from the electronic components and exhausting into the exhaust plenum 84 to start the cycle again.

It will be appreciated that the air flow circulates continuously in a horizontal pattern akin to the movement of a curtain. This movement pattern avoids problems with stack/chimney effect, as each device is directly fed with cooled air from the coil 92.

This means that unlike all vertical airflow systems, it is no longer critical where the hottest devices are placed. The horizontal airflow also encounters less problems with cabling resistance, which is an increasing problem for containment due to the effects of compaction already noted.

Moreover, the invention provides a much greater 'duct area' than is possible with a vertical system. Consider that the effective duct width for a conventional vertical system is set by the overall width of the cabinet enclosure (600 mm) although normally, due to structural requirements, the actual width is inside the rack rails, namely 500 mm or less. Ignoring systems which place the duct opening directly under the rack, the duct height depends upon the space available in front of the rack. This space can be as little as 30 mm in some cases; whereas from tests carried out with a variety of airflow areas, the minimum duct height should be 75 mm to 100 mm.

Even assuming a duct height of 100 mm is provided across the full 600 mm width of the cabinet enclosure, then the maximum effective duct area for conventional vertical airflow is just 0.1×0.6=0.06 m2. In comparison, the horizontal airflow of the invention enables full use of the cabinet height as the effective duct width. For example a 42U version of the cabinet has a duct extending for 1.9 m in cabinet height. Thus, for the same duct height of 100 mm, the effective duct area is $0.1 \times 1.9 = 0.19$ m$^2$ or over three times that of the conventional vertical system.

The cabinet 30 of the invention also benefits from markedly lower resistance to airflow. The horizontal airflow system of the invention requires four changes of direction to complete a full cycle whereas vertical airflow employing a central plant requires ten, made through more restricted ducts. Thus, the horizontal airflow system makes it possible to provide greater airflow to deal with very high loads; with less system resistance to airflow.

In the invention, the proximity of the cooling unit 38 to the equipment being cooled means that very little heat is transferred from the airflow to the inner walls of the cabinet. This, combined with the sealed environment, ensures that the cooling loads generated by the housed equipment do not influence other equipment close by. The more limited environmental area allows more precise automatic cooling to the level necessary at any given moment thus minimizing power consumption, and removing reliance on human intervention that is required with many existing cabinet enclosures.

Figure 6A:
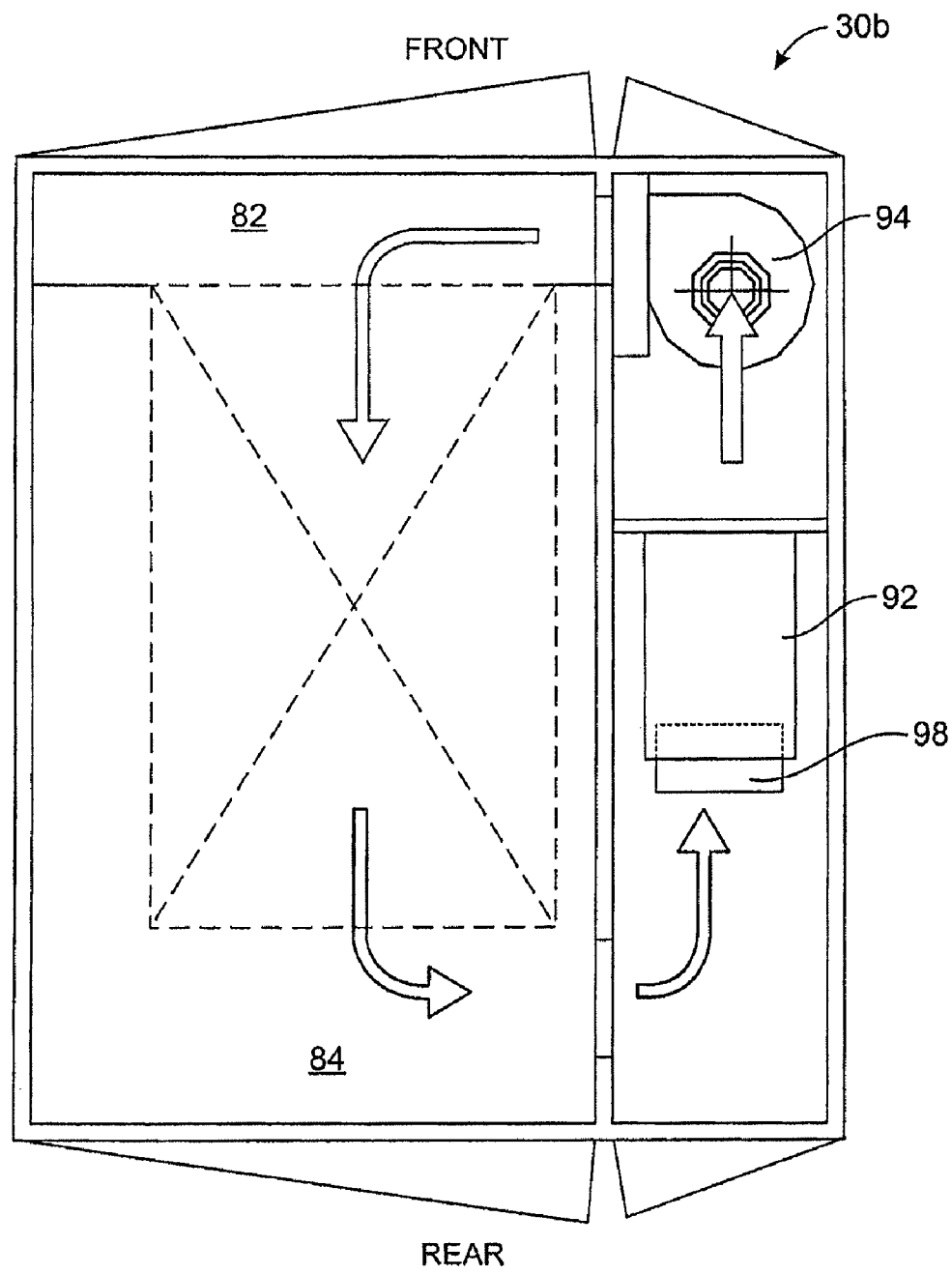
FIG. 6(*a*) is a sectional plan view of an alternative cabinet.
Figure 6B:
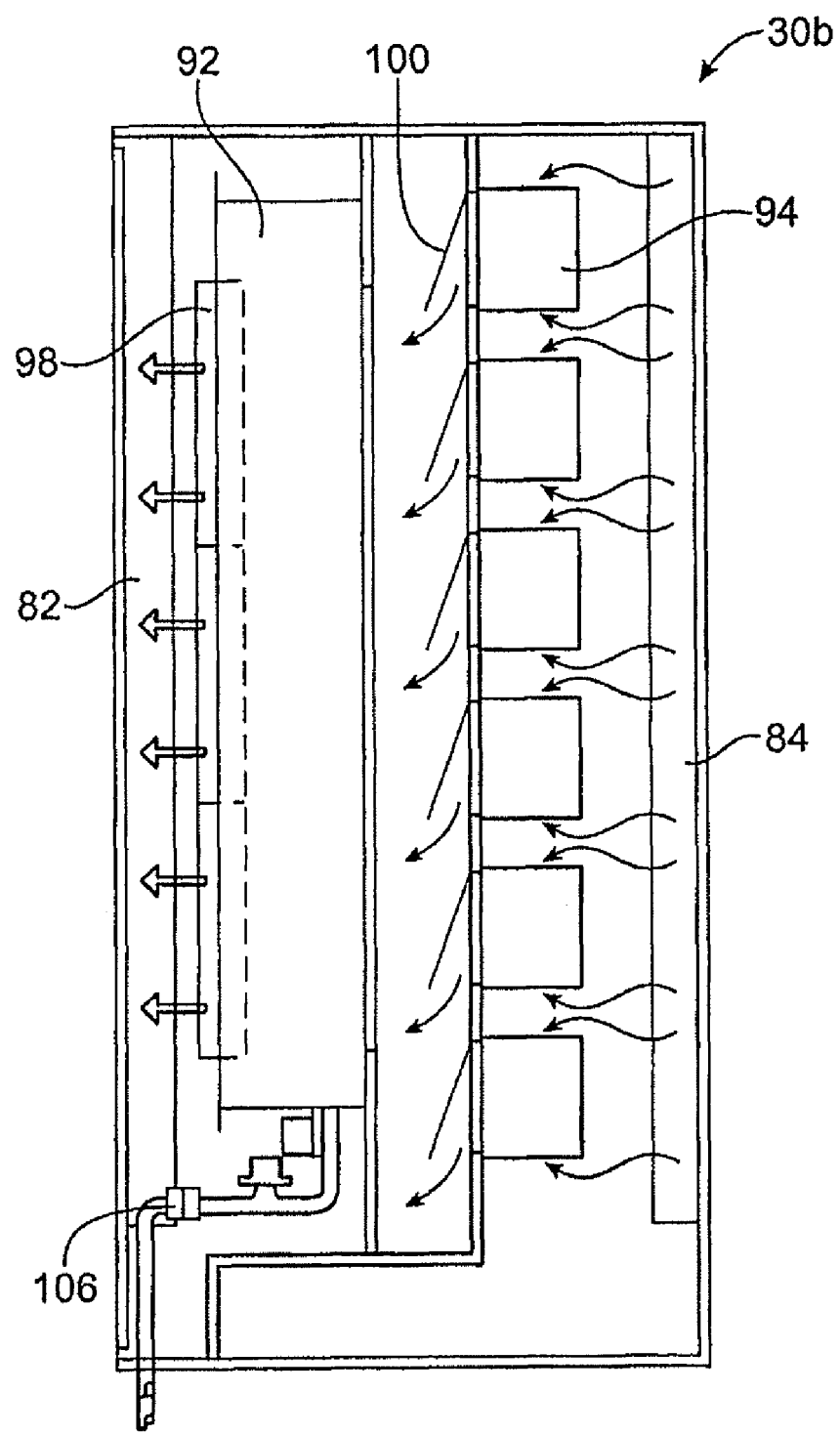

In a second variant of the invention as illustrated in FIGS. 6(a) and 6(b), the fans are positioned at the front of the cabinet 30b and pull air through the coil 92 which is located upstream of the fans, towards the rear of the cabinet 30b. The airflow is then as above, moving into the supply plenum 82; through the racked equipment; into the exhaust plenum 84 and then back through the coil 92 to start the cycle again.

In the preferred embodiments illustrated in FIGS. 5(a) to 5(c) and FIGS. 6(a) and 6(b), six fans 94 are arranged in a vertical array to push or pull the airflow through the coil 92. Five fans 94 are needed for load with one for redundancy in an n+1 arrangement. The number of fans 94 is directly related to the total cooling load and coil configuration. Currently a total of six are used for models which have total capacities of 15 kW to 20 kW of IT cooling load. Lower loads may require less fans but the principle is the same.

It is desirable that all fans 94 should run all the time, because fans are more likely to fail on start-up, especially if they have not been turned over regularly during maintenance. Should a fan fail, a non-return flap 100 closes over the failed fan to prevent 'short circuiting' of the airflow, whereupon the remaining fans speed up to take up the load. This non-return valve 100 feature is advantageous in the first embodiment where the fans are upstream of the coil, but is not necessary in the second embodiment where the fans are downstream of the coil.

The fans 94 are hot-swappable requiring the release of quick-release fittings and an electrical plug connector in a process that involves approximately four minutes to swap out a fan.

Monitoring equipment can detect increased power consumption by any fan, 94 indicating a possible future fan failure and allowing the unit to be swapped before the failure occurs. The combination of variable speed and chilled water valves linked to sensors permits efficient cooling levels to be maintained. In other words, only the level of cooling required of the mechanical equipment is delivered automatically at anytime.

N+1 redundancy is important for the fans 94, which are the most likely components to fail but is less important for the coil 92 which rarely fails. In any event, providing two coils 92 to achieve the same (n+1) level of redundancy as the fans would increase air resistance through the system, requiring larger fans and increasing power consumption.

Figure 7:
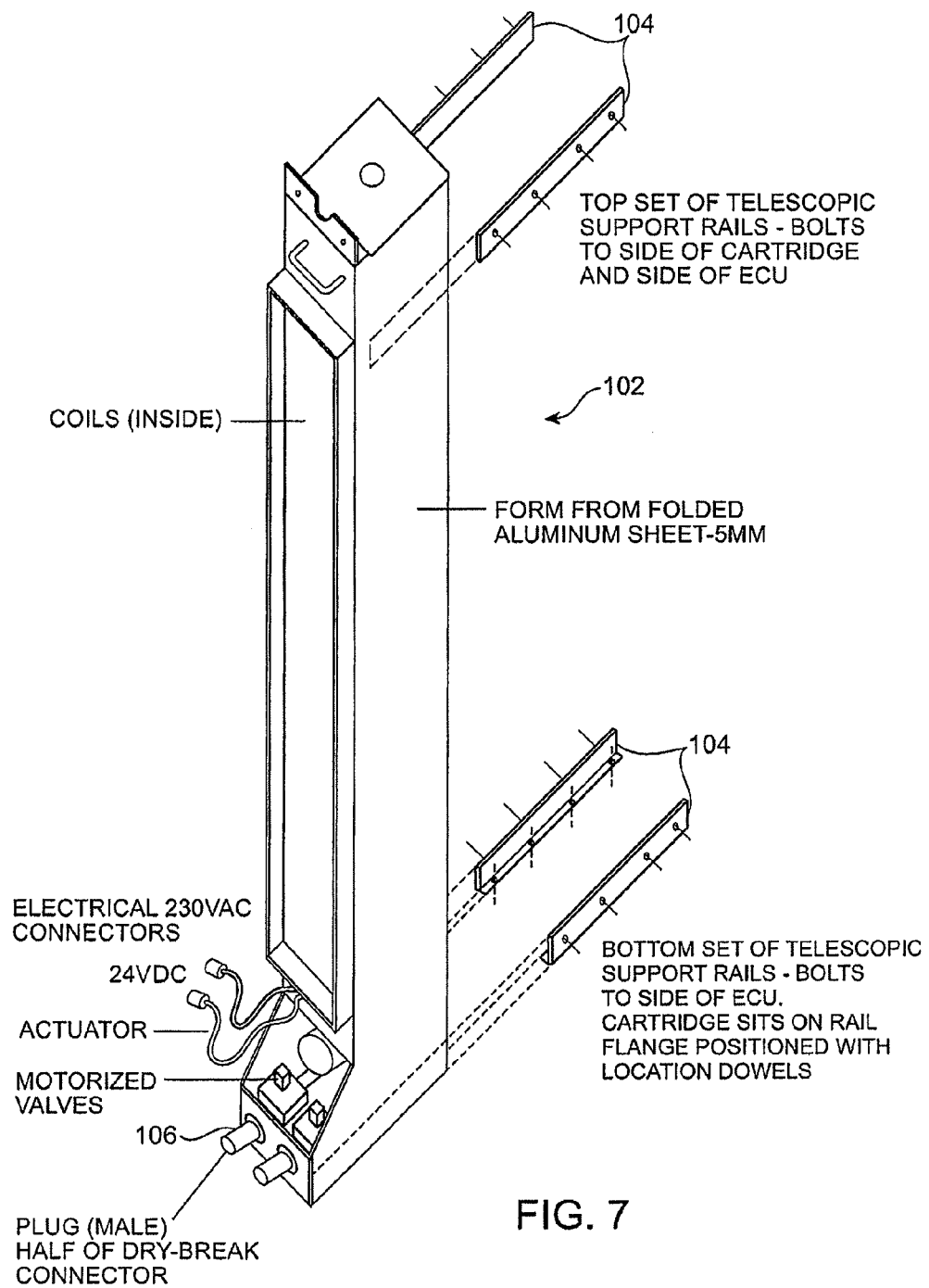
FIG. 7 is a perspective view of a cartridge and shows how a cartridge-type coil may be hot-swapped during maintenance or repair.

Coils rarely fail, but when they do it is sometimes catastrophically on commissioning or more likely as a result of a blow hole. Brazing flux lodged in a hole may not be revealed with a factory air test, but will then fail when filled with water upon commissioning. These incidents are very rare but not unknown, so the invention contemplates providing n+1 redundancy on the service but not the coil itself This is achieved by designing the coil as a cartridge which can be hot-swapped without shutting down the cabinet. To this end, the coil 92 complete with solenoid water isolation valves and two (or three) port modulating chilled water valves is made as an assembly 102, as shown in FIG. 7. The assembly 102 is mounted on telescopic rails 104 and connected to the flow and return pipework via 'dry break' connectors 106 in which an inner valve closes before an outer coupling releases to avoid any coolant spillage.

Monitoring procedures detect leaks and pressure loss within the coil 92. In the event of a coil failure, an engineer opens the doors to the ECU space leaving the fans 94 running. Room air continues to circulate through the racked equipment which might rise in temperature but will stay within its operational limits. By maintaining some airflow during coil swapping, the suddenness of temperature rise within the cabinet 30 is minimized and hence the risk of thermal shock damage to the equipment protected by the cabinet 30 is reduced. A thermal shock 'spike' representing a rate of temperature rise of 10° C. per hour is considered acceptable in this context.

Once access is gained by opening the doors 76, 80 to the ECU space, the dry break 92 lifted off the rails and replaced. The procedure is reversed with a new coil, the coil bled and the doors closed to resume normal operation. It is envisaged that the total time necessary to swap a coil will be less than about ten minutes.

The area in the ECU space below the coil cartridge 102 is tanked so that in the event of a spillage the contents of the coil 92 and the cabinet pipework etc are contained. Leak detection sensors within the tanked area provide an alarm condition in this situation. In the event of a catastrophic leak, the chilled water valves automatically close to prevent more fluid entering the cabinet enclosure (this facility can be disabled if required). In standard format, the outer hose of the aforementioned pipe-in-pipe system can be used as a drain. However if a fire-rated cabinet is required then this hole is fire-sealed and it is necessary to drain the 'tanked' area manually.

As mentioned above in relation to the door lock system, the cooling system is designed to maintain the cabinet environment above dew point to prevent condensation forming on the heat exchanger coil and being carried into the racked equipment by airflow or forming directly on the surface of the racked equipment. Design set point for the heat exchanger water inlet temperature is 11.5° C. with a 16.5° C. outlet temperature. The sealed environment of the cabinet means the external dew point can be ignored other than when the cabinet doors are opened, when the interlocking of the door locks and the environmental controls (described above) prevent dew point problems.

The cabinet ECU 38 in combination with the cabinet 30 provides a closed loop air/water system dealing with sensible heat only. For this reason there is no dehumidifier within the ECU 38. The continuously circulating air is drawn originally, and from time to time during operational and maintenance access from the room air. In a data center, this air will be maintained within prescribed humidity levels—normally 50% relative humidity (RH) plus or minus 5% from the central make up fresh air system. Some OEM specifications allow for a much wider humidity tolerance while quoting the figure of 50% RH as ideal. While too high humidity is to be avoided to prevent problems with condensation on equipment, too low humidity levels are also undesirable to avoid potential problems with static electricity.

During the last few years, there has been an increase in the number of equipment component failures due to humidity problems. This stresses the need to target the environment within an ideal humidity tolerance band. Where the cabinet 30 is to be located outside data center environments, i.e., lacking close temperature and humidity control, care must be taken to ensure the ability of the control system to prevent condensation via door interlocking is still viable. In other words the internal and external environment must be capable of being matched to stay above dew point but also maintain adequate cooling conditions for the equipment.

Where there is any doubt as to this requirement, then an outer enclosure should be used as illustrated in FIGS. 2(a) to 2(c) and FIGS. 3(a) to 3(c). This provides an insulated outer zone which is provided with a small package HVAC unit 36 to maintain a stable ambient environment of 22° C. 50% RH. The unit 36 provides cooling, heating (if required) and humidity control and is linked to the plant skid 42 by a similar but independent pipework system.

If the interconnecting pipe-in-pipe flow and return mains linking the cabinet heat exchanger to the plant skid 42 are not insulated, then a sensor is attached to the pipe.

Thus, in the event of the measured room dew point approaching the fluid temperature set point, the skid control panel will by means of the skid actuator and variable speed pump raise the fluid temperature say 1° C. or more to avoid condensation forming. However in standard format the pipe-in-pipe system is supplied pre-tested and insulated, so this facility is not needed. The skid primary chilled water circuit is 7.5° C. on supply.

The cabinet 30 of the invention is provided with dual-corded A and B power supplies as shown in FIG. 4, power monitoring and control facilities, and dual-corded C1 and C2 utility power supplies to the ECU 38.

The cabinet 30 of the invention may contain various internal features which are not essential to the invention and are not shown. For example, each power distribution unit (PDU) within the cabinet may contain an IEC socket outlet (a range of other outlets is possible to suit the country of location) which is numbered and has a status neon lamp. If required, 8U high modules (8 socket outlets) can be provided with individual socket power monitoring.

Another internal feature not shown is a rack-mounted fire protection unit (FPU) which provides an in-cabinet microprocessor-controlled sub-system for extinguishing fires within the cabinet 30. Fire detection is provided by an in-cabinet laser smoke detection unit. FM200 extinguishing agent (in a dual bottle arrangement) is preferred as this agent is electrically non-conductive and not harmful to electronic equipment or to personnel. In the event of a fire situation detected by the smoke detection unit, only the individual cabinet 30 is flooded with extinguishing agent and shut down rather than the whole room. After a fire, extinguishant gas and fire residue may be extracted from the cabinet using a mobile gas bottle and vacuum pump, connected to a tap off valve on the cabinet side. This also removes the need to install high and low level extract ductwork, complete with dampers and fans required for room level solutions.

The invention minimizes the impact of fire on the user's service, and minimizes the cost: say a replacement cost of $340.00 for gas as opposed to perhaps $136,000.00 for flooding a whole room of area 1,000 m$^2$, let alone the cost of downtime and possible equipment damage involved in flooding the whole room. Indeed, a suitably sensitive early warning detection system provides control personnel with the option to shut off the power to the rack, which will normally prevent a potential fire, before flooding the cabinet 30 with extinguishing agent.

An increased risk of fire follows from the process of compaction, requiring users to 20 consider their fire strategy. The value of business interruption for many users is far greater than the capital cost of equipment loss. The automatic system installed in the cabinet of the invention protects the racked equipment and limits the damage to one rack. Being a sealed cabinet, the risk of cold smoke damage to other equipment/services in the room is removed. In contrast, the majority of data rooms use a form of total flooding (either gas or water mist) to protect the room space directly but the rack interiors and equipment indirectly.

The invention has further benefits. For example, the cabinet construction of the invention together with its security systems provides a very high level of physical security required by many users and their insurers.

Moreover, by obviating raised floors, the invention avoids other problems such as the problem of metal whiskers, namely swarf from the edge of the floor tile cut-outs which may be carried by the airflow systems into the racked equipment of unsealed floor-ventilated rack cabinets.

The continuing increase in equipment and cable weight has the effect of increasing the loading within rack cabinets and therefore onto the raised floor. The full load capability of a raised floor is only realized when all of its tiles are in place. In other words, the lateral strength of the floor depends upon the presence of the tiles. As 'discussed above, tiles are often missing in many data centers. The increased load on the raised floor increases the point loads on the structural floor, often beyond acceptable limits.

For users in earthquake zones, raised floor systems create an additional hazard. While all systems are liable to experience downtime of hours or days due to loss of connectivity in the event of an earthquake, collapsed raised floors result in racked equipment damage which can extend downtime to more than a month.

Operation of the invention will now be described in more detail. The function of the plant is to maintain air in the data cabinet supply plenum at 22° C. 50% RH. The basic temperature 'set point' is 22° C. which can be adjusted via an optional remote display and adjust panel (not shown). All other parameters to tune the control loops can also be adjusted via the optional local display and adjust panel.

Due to temperature stratification in the supply air plenum 82, the average of two temperatures is used to ensure that the supply air temperature is adjusted to counter the mean cooling load in the cabinet. The supply air temperature set point is adjusted down from 22° C. to 20° C. when the average return temperature exceeds 34° C. Should any of the necessary sensors be unreliable, i.e., open or short circuit, it is removed from the averaged calculation.

The average of the two supply temperatures is compared with a sliding set point produced by the return air average temperature exceeding 34° C. The chilled water valve will then be modulated in accordance with a proportional plus integral control algorithm to maintain the set point.

All digital inputs are normally open for the fail condition to ensure that the wiring circuit integrity and circuit breakers are also monitored. The alarm output is switched off for an alarm condition, for the same reason.

Each variable volume fan maintains a constant static pressure under the control of a proportional plus integral control algorithm, using the duct static pressure transmitter as input. Should this transmitter be unreliable, the fan speed will be controlled at a fixed value. Following a power failure, the fan speed will ramp up gradually.

Each of the variable volume fans runs continuously unless disabled by any of the following conditions, namely:
  'Gas Gone'—if the in-cabinet fire protection gas dump system is active; if smoke input from the in-cabinet fire detection system is active;
  if the local isolator/alarm reset switch is off (hardwired into the controlled equipment); or
  the fan's respective fault condition is detected (hardwired into the controlled 20 equipment).

The chilled water valve will be forced 100% open if any of the following conditions is active, namely the supply fan is disabled or if all of the return air temperatures are unreliable (either open or short circuit).

The solenoid water isolating valves will be switched. off if water is detected within the unit.

In terms of security function, a 'door open panel light' will illuminate when all the 30 following conditions are active:
  there is a request from the control room system (if connected) and the cabinet card reader;

the dew point temperature in the cabinet is higher than the dew-point required to condense moisture from air entering the unit when the doors are opened; and there is no signal from the 'Gas Gone' alarm of the fire protection (extinguishing) unit.

The 'door open light panel light' will flash when all of the following conditions are active:

the there is a request from the control room system (if connected) and the cabinet card reader;

the dew point temperature in the cabinet is being adjusted to prevent condensation of moisture from the air entering the unit when the doors are opened; and there is no signal from the 'Gas gone' alarm of the fire protection (extinguishing) unit.

The ECU door magnetic locks will open when all of the following conditions are active:

there is a request from the control room system (if connected) and the cabinet card reader;

the dew point temperature in the cabinet is higher than the dew point required to condense moisture from the air entering the unit when the doors are opened; and there is no signal from the 'Gas gone' alarm of the fire protection (extinguishing) unit.

The equipment rack space magnetic locks will open when all of the following conditions are active:

there is a request from the control room system (if connected) and the cabinet card reader;

the dew point temperature in the cabinet is higher than the dew point required to condense moisture from the air entering the unit when the doors are opened; and there is no signal from the 'Gas gone' alarm of the fire protection (extinguishing) unit.

Moving on now to the Fire Detection and Protection System, the fire protection unit (FPU) has a lockable isolating switch, for use when work is being carried out in the cabinet. If the unit is locked off, the common fault will be activated. This common fault will not include the low gas pressure alarm, which is a separate input. When the air sampling smoke detection system gateway is included, the smoke input will come from a LON SNVT which will replace the hardwired connection.

In a manual condition, which assumes that a control room system is connected, the remote manual gas dump will be enabled if the following conditions are active:

the control room has authorized that this function is active via a network connection;

the smoke input from the air sampling smoke detection system unit is active;

the door magnetic locks are not released (ECU or equipment rack);

the pre-alarm input from the air sampling smoke detection system unit is active; and the fans are off.

In an automatic condition, which assumes a stand-alone configuration in which a control room system is not connected, the remote manual gas dump will be enabled if the following conditions are active. This is also a backup system to the remote manual gas dump, if the control room has not authorized the function within a given time, and the other inputs are still active:

the first knock is active (hardwired input from the air sampling smoke detection system to the FPU);

the pre-alarm input from the air sampling smoke detection system unit is active;

the second knock (smoke input from the air sampling smoke detection system 15 unit) is active;

the door magnetic locks are not released (ECU and equipment rack sections);

the fans are off; and a configurable time delay (0 to 120 secs) has elapsed.

Moving on now to alarms, a 'common plant alarm' will be enabled if any of the following conditions is active:

there is a fire! smoke alarm from the air sampling smoke detection system unit;

there is a fault signal from the air sampling smoke detection unit;

there is a pre-alarm from the air sampling smoke detection unit;

the 'Gas gone' signal is active from the FPU;

there is a 'low gas' signal from the FPU;

there is a common fault signal from the FPU;

the filter is dirty;

the front door status does not match the commanded position (following a grace period of 5 minutes—only if the control room is connected);

the back door status does not match the commanded position (following a grace period of five minutes—only if the control room is connected);

water is detected within the unit;

vibration is detected within the unit;

the temperature 'set-point' is not being maintained (plus or minus 2° C.) following 30 minutes after a power failure; or the cabinet humidity is less than 45% RH or greater than 50% RH, following minutes after a power failure.

The above output will latch until reset via a control room system (if connected) or from the portable display and adjust panel.

A "fire alarm' (flashing lamp on' the panel) will be enabled if there is a fire/smoke' alarm from the air sampling smoke detection unit. This output will also latch until reset via a control room system (if connected) or from the portable display and adjust panel.

A 'gas gone lamp' will be enabled if there is a 'gas gone' signal from the FPU (this is a hardwired signal) and this will indicate which unit the alarm relates to when several units are connected together.

It will be apparent to those skilled in the art that the invention has very numerous and considerable benefits over the prior art. It provides a safe and secure total environment for locating existing and new IT/electrical critical technology in high-density deployment. This environment is provided in a form that can be utilized in any location where it might reasonably be required: it is not necessarily dependent on a conventional data room location. The environment is also provided in a form that permits full use (i.e., 100%) of the equipment space for hot devices if required.

The environment systems of the invention provide high availability and fault tolerance 10 both under operational and maintenance conditions. The environment is 'room neutral' i.e. the cabinet of the invention does not contribute to any additional cooling loads or receive any additional cooling loads from its surrounding space. It provides means for remote proactive monitoring and control of the environment systems to ensure maximum uptime. It removes as far as possible the need for personnel to schedule the order of deployment (stacking) of equipment for good thermal management. It automates as far as possible the environment control systems to avoid the need for manual intervention and the resulting risks of downtime. It provides true scalability upwards and downwards across all environmental systems, while maintaining environmental conditions suitable for the correct operation of all vendor/OEM products. The invention allows efficient energy consumption both for operational and maintenance requirements throughout the whole life of an installation and at any given stage of build-out.

The invention provides a seamless means of avoiding the 'fuzzy edge disease' of the industry, in the words, the interface problems arising between traditional complex systems provided from a variety of specialist sources, especially high costs, increased timescales, lower availability, multiple points of failure and long mean times to repair. It provides certainty to users, removing as many of the traditional uncertainties and variables as possible and thereby simplifying the decision/design process when configuring a facility.

In general, the invention may be embodied in many forms. When determining the scope of the invention, reference should therefore be made to the appended claims and to other conceptual statements herein, rather than the foregoing' specific description.

What is claimed is:

1. A data center system including:
a heat exchanger;
a cooling mechanism including an impeller array comprising a plurality of vertically arranged impellers such that the impellers are arranged vertically one above another in use; and
a substantially sealed, substantially airtight cabinet sized for housing a vertical array of heat-producing units, the cabinet having an exterior shell and the system including an interior divider wall disposed inside the cabinet, the shell and divider wall providing a heat exchanger chamber in which the heat exchanger is disposed, the shell and divider wall providing an equipment chamber separate from the heat exchanger chamber and adapted to support the array of heat-producing units such that the array of heat-producing units cooperates with the shell and divider wall in use to define a first plenum, the first plenum having a first inlet defined by the divider wall for receiving a flow of cooling gas and having a first outlet defined by a plurality of openings through the array whereby the first plenum communicates with the openings in use to exhaust substantially all of the flow of cooling gas through the openings and hence through the array, wherein the divider wall is configured such that the first inlet at least partially vertically overlaps with the plurality of openings through the array to allow the first inlet to admit the gas through the first plenum in a substantially horizontal direction;
wherein the plurality of vertically arranged impellers are disposed in the heat exchanger chamber vertically overlapping with the first inlet, the plurality of vertically arranged impellers configured to horizontally impel a substantially uniform curtain of gas directly to or directly from the heat exchanger and to the first inlet and impel the gas substantially horizontally during an entire circulation of the gas through the equipment chamber and the heat exchanger chamber; and
wherein the impellers provide N+1 redundancy of gas impelling.

2. The system of claim 1 wherein the divider wall is configured such that the first inlet will admit the gas over a substantial vertical length of the cabinet.

3. The system of claim 1 wherein the divider wall is configured such that the first inlet will admit the gas substantially uniformly over a vertical length of the first inlet.

4. The system of claim 3 wherein the first inlet is at least one substantially vertical slot beside the first plenum.

5. The system of claim 3 wherein the first inlet extends substantially a full vertical extent of at least one of the array and the first plenum.

6. The system of claim 1 wherein a second plenum is defined between the shell and the array for receiving the flow of gas that has passed through the array, the second plenum having a second inlet defined by a second plurality of openings through the array, and a second outlet defined by the divider wall such that the gas is directed horizontally from the equipment chamber.

7. The system of claim 6 wherein the cabinet shell and divider wall are configured to direct the gas that has passed through the array to the cooling mechanism.

8. The system of claim 7 further comprising a plurality of heat exchangers.

9. The system of claim 1 further comprising at least one filter configured to filter the flow of gas.

10. The system of claim 1 wherein the heat exchanger is upstream of the impeller array.

11. The system of claim 1 wherein the heat exchanger is downstream of the impeller array.

12. The system of claim 1 wherein each impeller is associated with a non-return valve that closes in the event of failure of that impeller.

13. The system of claim 9 wherein at least a first heat exchanger of the plurality of heat exchangers is a module replaceable during use of the array of heat-producing units and system.

14. The system of claim 13 wherein the first heat exchanger is mounted to the cabinet on runners configured to support the first heat exchanger when the first heat exchanger is withdrawn from the cabinet.

15. The system of claim 9 wherein at least a second heat exchanger of the plurality of heat exchangers is coupled to coolant supply ducts by dry-break connectors.

16. The system of claim 1 wherein the flow of the gas through the equipment chamber is substantially parallel to and opposed to the flow of the gas through the mechanism chamber.

17. The system of claim 1 wherein the cabinet includes a mechanism-access door configured to provide access to the mechanism chamber without providing access to the equipment chamber.

18. The system of claim 17 wherein the cabinet further comprises an equipment-access door, wherein the mechanism-access and equipment-access doors have independent locks and are each capable of permitting access to only one of the equipment and the mechanism chambers, respectively.

19. The system of claim 18 wherein the doors provide substantially vertically upright walls of the cabinet.

20. The system of claim 1 further including heat transfer means disposed in the cabinet for carrying heat away from the cabinet.

21. The system of claim 1 further comprising a door configured to provide selective access to the heat-producing units based on at least one of (1) an environmental compatibility inside and outside the cabinet, and (2) whether an outer enclosure around the cabinet is closed.

22. The system of claim 1 further comprising an outer enclosure disposed around a substantial portion of the cabinet.

23. The system of claim 22 further comprising an air conditioner disposed and configured to control at least one of temperature and humidity of air between the cabinet and the outer enclosure.

24. The system of claim 22 wherein the outer enclosure includes external panels displaced from walls of the outer enclosure.

25. The system of claim 1 wherein the impeller array is configured such that any of the impellers can be replaced while the other impellers continue to operate.

26. The system of claim 25 wherein each of the impellers is removably connected to the cabinet with quick-release fittings.

27. A data center system including:
a heat exchanger;
a cooling mechanism including an impeller array comprising a plurality of vertically arranged impellers such that the impellers are arranged vertically one above another in use; and
a substantially sealed, substantially airtight cabinet sized for housing a vertical array of heat-producing units, the cabinet having an exterior shell and the system including an interior divider wall disposed inside the cabinet, the shell and divider wall providing a heat exchanger chamber in which the heat exchanger is disposed, the shell and divider wall providing an equipment chamber separate from the heat exchanger chamber and adapted to support the array of heat-producing units such that the array of heat-producing units cooperates with the shell and divider wall in use to define a first plenum, the first plenum having a first inlet defined by the divider wall for receiving a flow of cooling gas and having a first outlet defined by a plurality of openings through the array whereby the first plenum communicates with the openings in use to exhaust substantially all of the flow of cooling gas through the openings and hence through the array, wherein the divider wall is configured such that the first inlet at least partially vertically overlaps with the plurality of openings through the array to allow the first inlet to admit the gas through the first plenum in a substantially horizontal direction;
wherein the plurality of vertically arranged impellers are disposed in the heat exchanger chamber vertically overlapping with the first inlet, the plurality of vertically arranged impellers configured to horizontally impel a substantially uniform curtain of gas through the heat exchanger and to the first inlet and impel the gas substantially horizontally during an entire circulation of the gas through the equipment chamber and the heat exchanger chamber, and the flow of gas through the array is substantially parallel and opposed to the flow of gas through the heat exchanger, wherein the impeller array is configured such that any of the impellers can be replaced while the other impellers continue to operate.

28. The system of claim 27 wherein each of the impellers is removably connected to the cabinet with quick-release fittings.

* * * * *